(12) United States Patent
Ha et al.

(10) Patent No.: US 11,296,204 B2
(45) Date of Patent: Apr. 5, 2022

(54) SEMICONDUCTOR DEVICES

(71) Applicant: Samsung Electronics Co., Ltd., Suwon-si (KR)

(72) Inventors: Seungseok Ha, Hwaseong-si (KR); Gukil An, Goyang-si (KR); Keun Hwi Cho, Seoul (KR); Sungmin Kim, Incheon (KR)

(73) Assignee: Samsung Electronics Co., Ltd.

( * ) Notice: Subject to any disclaimer, the term of this patent is extended or adjusted under 35 U.S.C. 154(b) by 8 days.

(21) Appl. No.: 16/418,705

(22) Filed: May 21, 2019

(65) Prior Publication Data

US 2020/0013870 A1  Jan. 9, 2020

(30) Foreign Application Priority Data

Jul. 5, 2018 (KR) .................. 10-2018-0078290
Jan. 3, 2019 (KR) .................. 10-2019-0000811

(51) Int. Cl.
| | |
|---|---|
| *H01L 29/51* | (2006.01) |
| *H01L 29/49* | (2006.01) |
| *H01L 29/786* | (2006.01) |
| *H01L 29/423* | (2006.01) |

(52) U.S. Cl.
CPC ...... *H01L 29/516* (2013.01); *H01L 29/42364* (2013.01); *H01L 29/42392* (2013.01); *H01L 29/4966* (2013.01); *H01L 29/78696* (2013.01)

(58) Field of Classification Search
CPC . H01L 29/78; H01L 29/78391; H01L 29/785; H01L 29/51
See application file for complete search history.

(56) References Cited

U.S. PATENT DOCUMENTS

| | | | |
|---|---|---|---|
| 9,831,239 B1 | 11/2017 | Shin et al. | |
| 9,853,150 B1* | 12/2017 | Colinge | ............ H01L 29/40111 |
| 2016/0358915 A1 | 12/2016 | Flachowsky et al. | |
| 2017/0162702 A1* | 6/2017 | Hu | ......... H01L 29/775 |
| 2017/0256611 A1* | 9/2017 | Kim | ......... H01L 29/775 |
| 2018/0151745 A1 | 5/2018 | Chang et al. | |
| 2018/0315833 A1* | 11/2018 | Duriez | .................. B82Y 10/00 |
| 2019/0019875 A1* | 1/2019 | Tsai | ................. H01L 29/66545 |
| 2019/0088760 A1* | 3/2019 | Lee | ..................... H01L 27/0924 |
| 2019/0189625 A1* | 6/2019 | Cheng | ............... H01L 29/66742 |
| 2020/0105940 A1* | 4/2020 | Maj | .................. H01L 29/66757 |

* cited by examiner

*Primary Examiner* — Marcos D. Pizarro
*Assistant Examiner* — Quinton A Brasfield
(74) *Attorney, Agent, or Firm* — Myers Bigel, P.A.

(57) ABSTRACT

Semiconductor devices and methods of forming the same are provided. The semiconductor devices may include a substrate, a pair of semiconductor patterns adjacent to each other on the substrate, a gate electrode on the pair of semiconductor patterns, a source/drain pattern connected to the pair of semiconductor patterns, and a ferroelectric pattern on surfaces of the pair of semiconductor patterns. The surfaces of the pair of semiconductor patterns may face each other, and the ferroelectric pattern may define a first space between the pair of semiconductor patterns. The gate electrode may include a work function metal pattern that is in the first space.

16 Claims, 43 Drawing Sheets

SEMICONDUCTOR DEVICES

CROSS-REFERENCE TO RELATED APPLICATIONS

This U.S. nonprovisional application claims priority under 35 U.S.C § 119 to Korean Patent Application Nos. 10-2018-0078290 filed on Jul. 5, 2018 and 10-2019-0000811 filed on Jan. 3, 2019 in the Korean Intellectual Property Office, the disclosures of which are hereby incorporated by reference in their entireties.

BACKGROUND

The present inventive concepts relate to a semiconductor device, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, the MOSFETs have been scaled down. The scale down of MOSFETs may deteriorate operating characteristics of the semiconductor device. Accordingly, various research has been conducted to develop methods of fabricating semiconductor devices having superior performances while overcoming issues associated with high integration of the semiconductor devices.

SUMMARY

Some example embodiments of the present inventive concepts provide a semiconductor device with improved electrical characteristics.

According to some example embodiments of the present inventive concepts, semiconductor devices may include a substrate, a pair of semiconductor patterns adjacent to each other on the substrate, a gate electrode on the pair of semiconductor patterns, a source/drain pattern connected to the pair of semiconductor patterns, and a ferroelectric pattern on surfaces of the pair of semiconductor patterns. The surfaces of the pair of semiconductor patterns may face each other, and the ferroelectric pattern may define a first space between the pair of semiconductor patterns. The gate electrode may include a work function metal pattern that is in the first space.

According to some example embodiments of the present inventive concepts, semiconductor devices may include a substrate, a first source/drain pattern on the substrate, and a pair of semiconductor patterns on the first source/drain pattern, a gate electrode on sidewalls of the pair of semiconductor patterns, and a ferroelectric pattern between the gate electrode and the pair of semiconductor patterns. The pair of semiconductor patterns may extend in a vertical direction that is perpendicular to a top surface of the substrate.

According to some example embodiments of the present inventive concepts, semiconductor devices may include a substrate and an active pattern on the substrate. The active pattern may include a first source/drain pattern, a semiconductor pattern on the first source/drain pattern, and a second source/drain pattern on the semiconductor pattern. The semiconductor pattern may extend in a vertical direction that is perpendicular to a top surface of the substrate, and the semiconductor pattern may be between the first source/drain pattern and the second source/drain pattern. The semiconductor devices may also include a gate electrode on a sidewall of the semiconductor pattern and a ferroelectric pattern between the gate electrode and the semiconductor pattern. A top surface of the gate electrode may be lower than a top surface of the semiconductor pattern.

DETAILED DESCRIPTION

Figure 1:
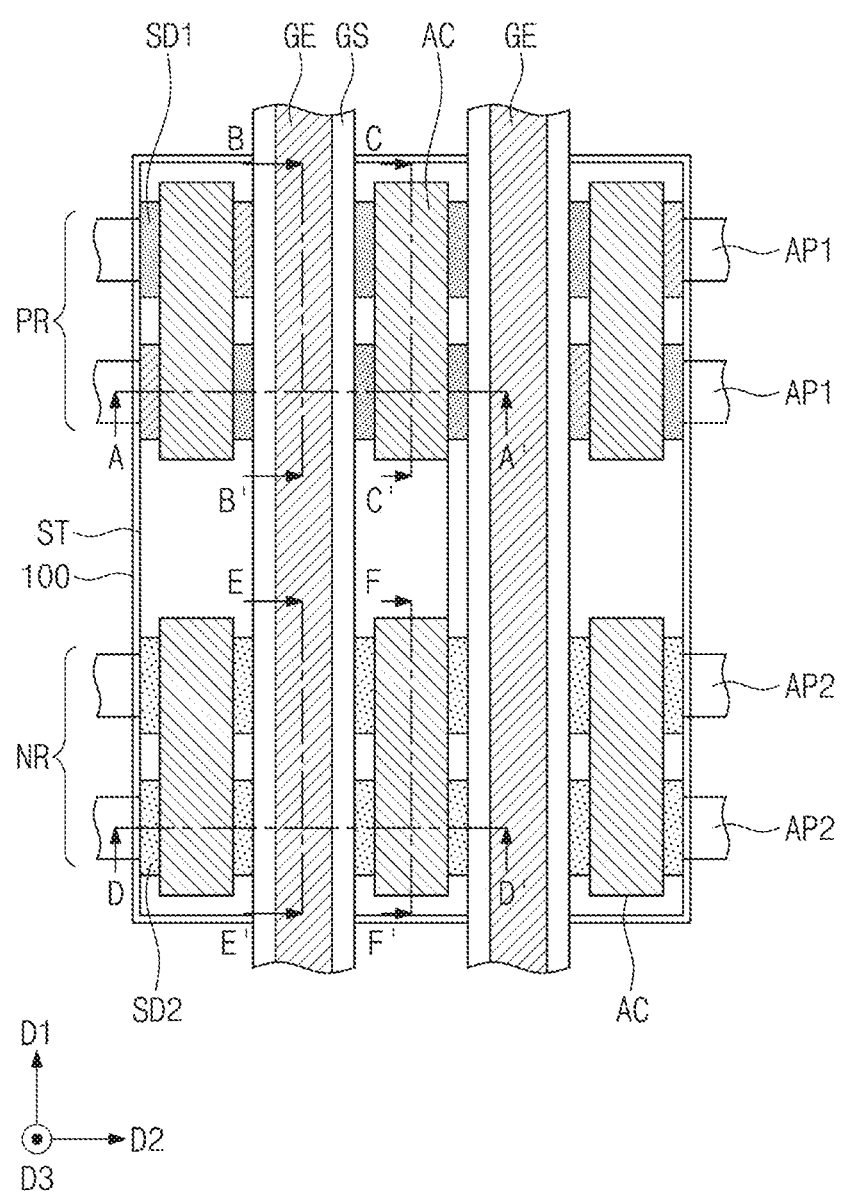
FIG. 1 illustrates a plan view of a semiconductor device according to some example embodiments of the present inventive concepts.

FIG. 1 illustrates a plan view of a semiconductor device according to some example embodiments of the present inventive concepts. FIGS. 2A to 2F illustrate cross-sectional views respectively taken along lines A-A', B-B', C-C', D-D', E-E', and F-F' of FIG. 1.

Referring to FIGS. 1 and 2A to 2F, a substrate 100 may be provided. For example, the substrate 100 may be a silicon substrate, a germanium substrate, or a silicon-on-insulator (SOI) substrate. The substrate 100 may have a zone including a PMOSFET region PR and an NMOSFET region NR. The zone of the substrate 100 may be a logic area. The logic area may be provided thereon with logic transistors included in a logic circuit.

The logic transistors may include first transistors on the PMOSFET region PR and second transistors on the NMOSFET region NR. The first transistors on the PMOSFET region PR may have a different conductivity type from that of the second transistors on the NMOSFET region NR. For example, the first transistors on the PMOSFET region PR may be PMOSFETs, and the second transistors on the NMOSFET region NR may be NMOSFETs.

A device isolation layer ST may be provided on the substrate 100. The device isolation layer ST may define first and second active patterns AP1 and AP2 on an upper portion of the substrate 100. The first active patterns AP1 may be disposed on the PMOSFET region PR. The second active patterns AP2 may be disposed on the NMOSFET region NR. Each of the first and second active patterns AP1 and AP2 may have a linear or bar shape extending in a second direction D2. The second direction D2 may be referred to as a horizontal direction as the second direction D2 is parallel to a surface (e.g., a top surface or a bottom surface that is opposite the top surface) of the substrate 100. In some embodiments, the top surface and the bottom surface of the substrate 100 may be parallel to each other.

Figure 2A:
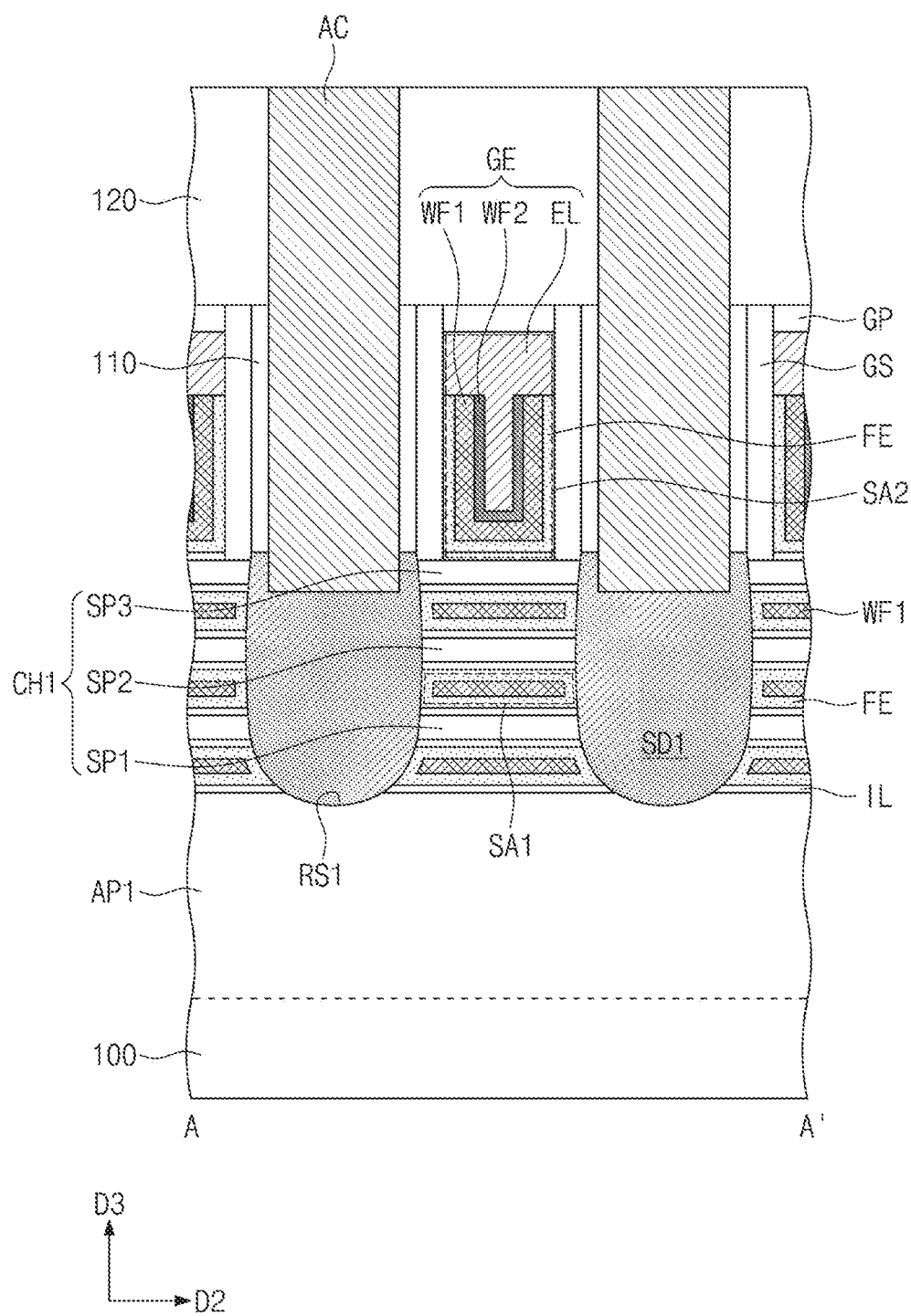
FIGS. 2A to 2F illustrate cross-sectional views respectively taken along lines A-A', B-B', C-C', D-D', E-E', and F-F' of FIG. 1.
Figure 2B:
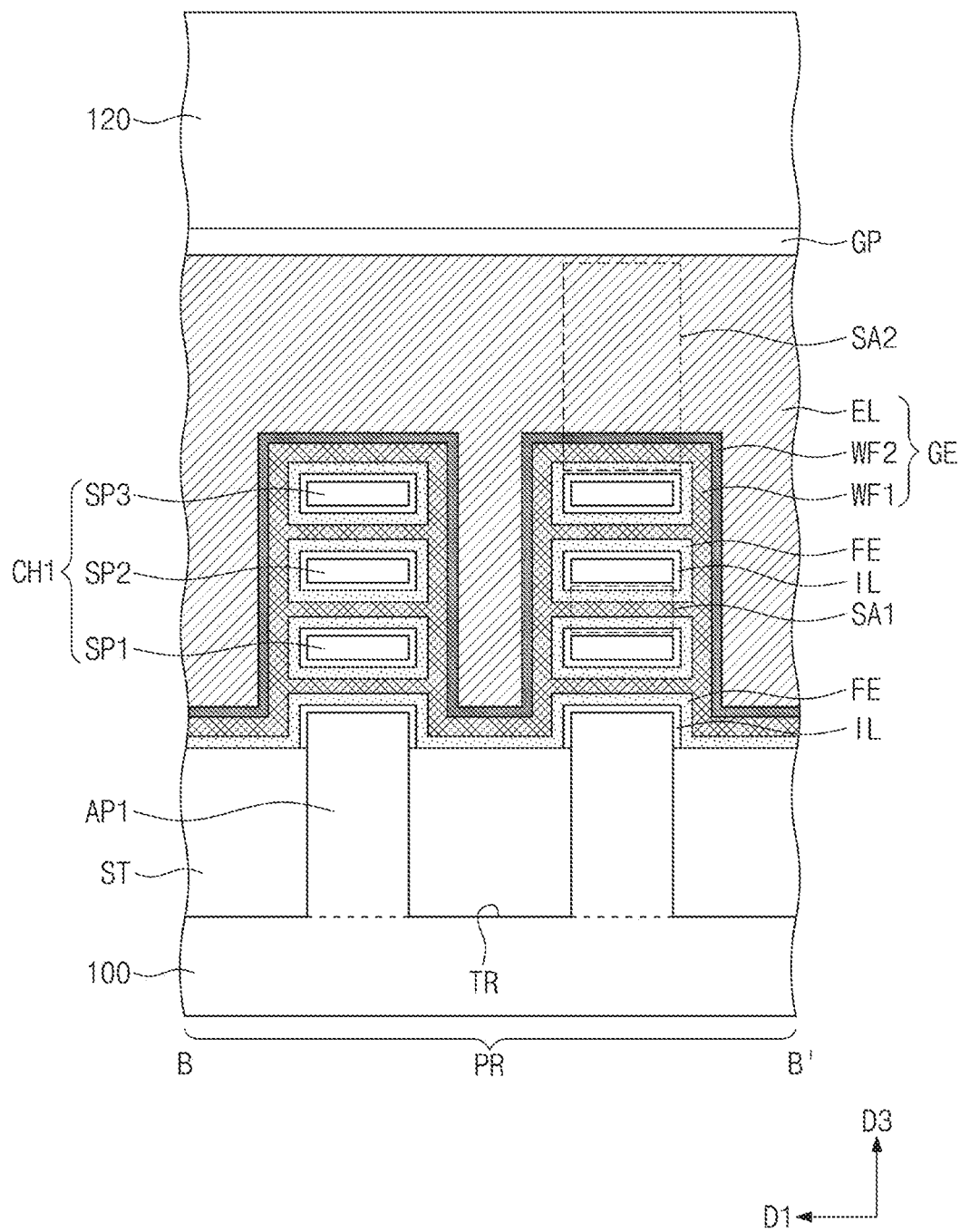
Figure 2C:
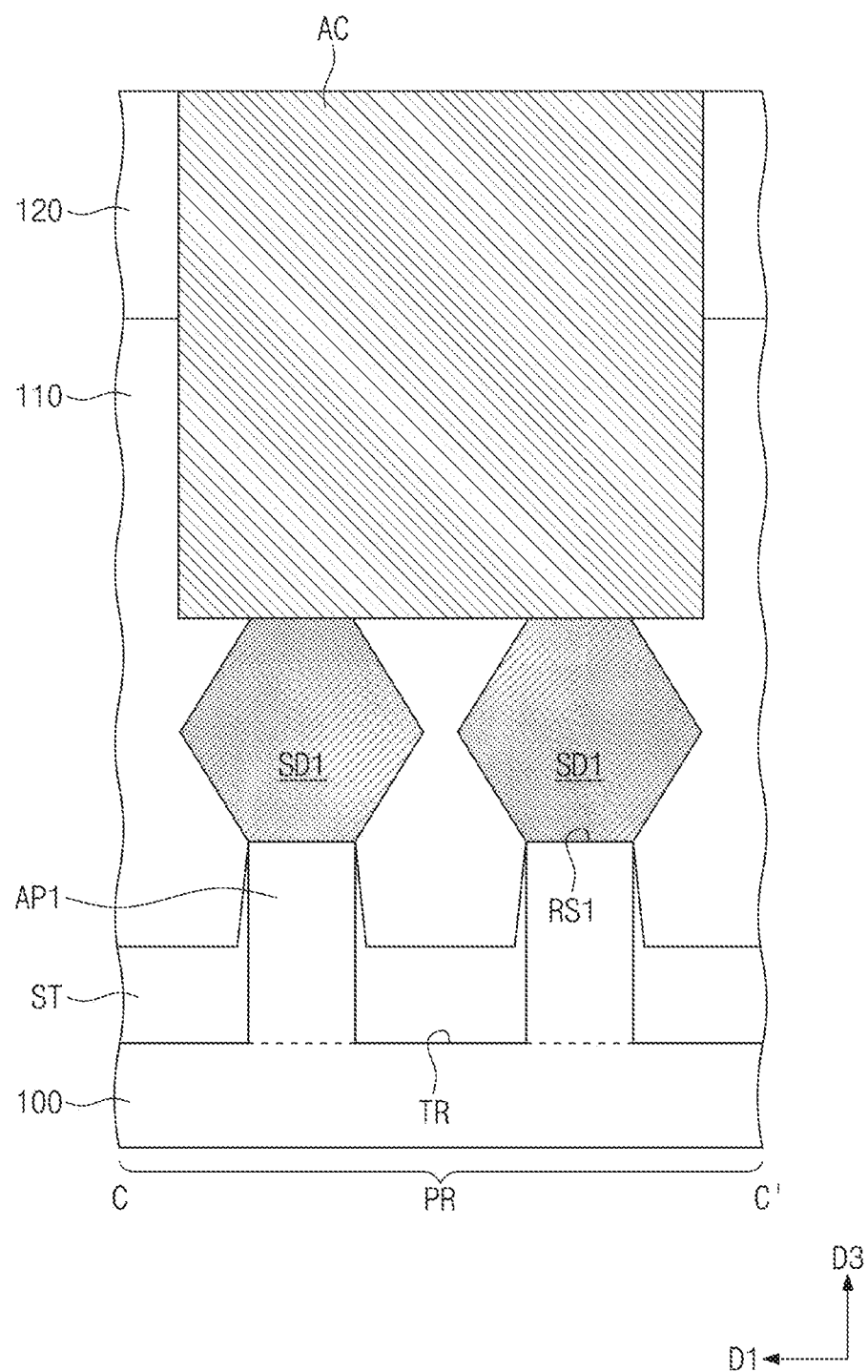

The device isolation layer ST may fill a trench TR between a pair of adjacent first active patterns AP1. The device isolation layer ST may fill a trench TR between a pair of adjacent second active patterns AP2. The device isolation layer ST may have a top surface lower than those of the first and second active patterns AP1 and AP2. It will be understood that "an element A fills an element B" (or similar language) as used herein means that the element A is in the element B but does not necessarily mean that the element A fills the element B entirely. It will be also understood that the term "a pair of adjacent elements A" as used herein may refer to two elements A between which no other like element is located. For example, as shown in FIG. 2B, two first active patterns AP1 can be referred to as a pair of adjacent first active patterns AP1 as there is no first active pattern AP1 between the two first active patterns AP1.

First channel patterns CH1 and first source/drain patterns SD1 may be provided on each of the first active patterns AP1. Each of the first channel patterns CH1 may be interposed between a pair of adjacent first source/drain patterns SD1. Second channel patterns CH2 and second source/drain patterns SD2 may be provided on each of the second active patterns AP2. Each of the second channel patterns CH2 may be interposed between a pair of adjacent second source/drain patterns SD2.

Each of the first channel patterns CH1 may include first, second, and third semiconductor patterns SP1, SP2, and SP3 that are sequentially stacked. The first, second, and third semiconductor patterns SP1, SP2, and SP3 may be spaced apart from each other in a third direction D3 (e.g., a vertical direction) that may be perpendicular to a surface (e.g., a top surface or a bottom surface that is opposite the top surface) of the substrate 100. The first, second, and third semiconductor patterns SP1, SP2, and SP3 may vertically overlap each other. The first source/drain patterns SD1 may directly contact corresponding sidewalls of the first, second, and third semiconductor patterns SP1, SP2, and SP3. For example, the first, second, and third semiconductor patterns SP1, SP2, and SP3 may connect a pair of adjacent first source/drain patterns SD1 to each other. It will be understood that "an element A vertically overlapping an element B" (or similar language) as used herein means that at least one vertical line intersecting both the elements A and B exists. In some embodiments the third direction D3 may be perpendicular to the second direction D2.

The first, second, and third semiconductor patterns SP1, SP2, and SP3 of the first channel pattern CH1 may have the same or different thicknesses (e.g., thicknesses in the third direction D3). The first, second, and third semiconductor patterns SP1, SP2, and SP3 of the first channel pattern CH1 may have different largest lengths (e.g., maximum lengths) in the second direction D2. For example, a first length may refer to the maximum length in the second direction D2 of the first semiconductor pattern SP1. A second length may refer to the maximum length in the second direction D2 of the second semiconductor pattern SP2. In some embodiments, the first length may be greater than the second length, as shown in FIG. 2A.

The first, second, and third semiconductor patterns SP1, SP2, and SP3 of the first channel pattern CH1 may include one or more of silicon (Si), germanium (Ge), and silicon-germanium (SiGe). The first channel pattern CH1 is illustrated to include the first, second, and third semiconductor patterns SP1, SP2, and SP3, but the number of semiconductor patterns is not particularly limited. In some embodiments, the first channel pattern CH1 may include one or two semiconductor patterns or more than three semiconductor patterns.

Each of the second channel patterns CH2 may include first, second, and third semiconductor patterns SP1, SP2, and SP3 that are sequentially stacked. The first, second, and third semiconductor patterns SP1, SP2, and SP3 of the second channel pattern CH2 may have substantially the same length in the second direction D2. A detailed description of the first, second, and third semiconductor patterns SP1, SP2, and SP3 included in the second channel pattern CH2 may be substantially identical or similar to that of the first, second, and third semiconductor patterns SP1, SP2, and SP3 included in the first channel pattern CH1 discussed above.

The first, second, and third semiconductor patterns SP1, SP2, and SP3 of the first channel pattern CH1 and a first recess RS1 of the first active pattern AP1 (e.g., a portion of the first active pattern AP1 defining the first recess RS1) may serve as a seed layer from which each of the first source/drain patterns SD1 is grown as an epitaxial pattern. Each of the first source/drain patterns SD1 may fill the first recess RS1 of the first active pattern AP1. The first recess RS1 may be defined between the first channel patterns CH1 adjacent to each other. In some embodiments, the first recess RS1 may have a floor (e.g., a lowermost end) lower than the top surface of the first active pattern AP1, as shown in FIG. 2A.

The first source/drain pattern SD1 may have a maximum width in the second direction D2 at or near a middle portion thereof (see FIG. 2A). A width in the second direction D2 of the first source/drain pattern SD1 may increase as approaching the middle portion from an upper portion of the first source/drain pattern SD1. The width in the second direction D2 of the first source/drain pattern SD1 may decrease as approaching a lower portion of the first source/drain pattern SD1 from the middle portion. In some embodiments, the width of first source/drain pattern SD1 in the second direction D2 may increase up to the widest width (e.g., maximum width) and then may decrease with a depth of the first recess RS1, as illustrated in FIG. 2A.

The first source/drain patterns SD1 may be p-type impurity regions. The first source/drain patterns SD1 may include a material that provides the first channel pattern CH1 with compressive stress. For example, the first source/drain patterns SD1 may include a semiconductor element (e.g., SiGe) whose lattice constant is greater than that of a semiconductor element of the substrate 100.

The first, second, and third semiconductor patterns SP1, SP2, and SP3 of the second channel pattern CH2 and a second recess RS2 of the second active pattern AP2 (e.g., a portion of the first active pattern AP1 defining the first recess RS1) may serve as a seed layer from which each of the second source/drain patterns SD2 is grown as an epitaxial pattern. Each of the second source/drain patterns SD2 may fill the second recess RS2 of the second active pattern AP2. The second recess RS2 may be defined between the second channel patterns CH2 adjacent to each other. The second recess RS2 may have a floor lower than the top surface of the second active pattern AP2.

The second source/drain patterns SD2 may be n-type impurity regions. For example, the second source/drain patterns SD2 may include the same semiconductor element (e.g. Si) as that of the substrate 100.

A semiconductor element contained in the first source/drain pattern SD1 may be different from that contained in the second source/drain pattern SD2. A cross-sectional shape taken along a first direction D1 of the first source/drain pattern SD1 may be different from that of the second source/drain pattern SD2 (see FIGS. 2C and 2F).

Gate electrodes GE may be provided to extend in the first direction D1, while running across the first and second channel patterns CH1 and CH2. The gate electrodes GE may be spaced apart from each other in the second direction D2. The gate electrodes GE may vertically overlap the first and second channel patterns CH1 and CH2. The first direction D1 may be referred to as a horizontal direction as the first direction D1 is parallel to a surface (e.g., a top surface or a bottom surface that is opposite the top surface) of the substrate 100. In some embodiments, the first direction D1 may be perpendicular the second direction D2 and/or the third direction D3.

Each of the gate electrodes GE may include a first work function metal pattern WF1, a second work function metal pattern WF2, and an electrode pattern EL. The second work function metal pattern WF2 may be disposed on the first work function metal pattern WF1, and the electrode pattern EL may be disposed on the second work function metal pattern WF2.

The first work function metal pattern WF1 may include a metal nitride layer, for example, a titanium nitride (TiN) layer or a tantalum nitride (TaN) layer. The second work function metal pattern WF2 may include metal carbide doped with (or containing) aluminum or silicon. For example, the second work function metal pattern WF2 may include TiAlC, TaAlC, TiSiC, or TaSiC.

The electrode pattern EL may have a lower resistance than those of the first work function metal pattern WF1 and the second work function metal pattern WF2. For example, the electrode pattern EL may include at least one low-resistance or low-resistivity metal, such as aluminum (Al), tungsten (W), titanium (Ti), and tantalum (Ta).

Figure 2D:
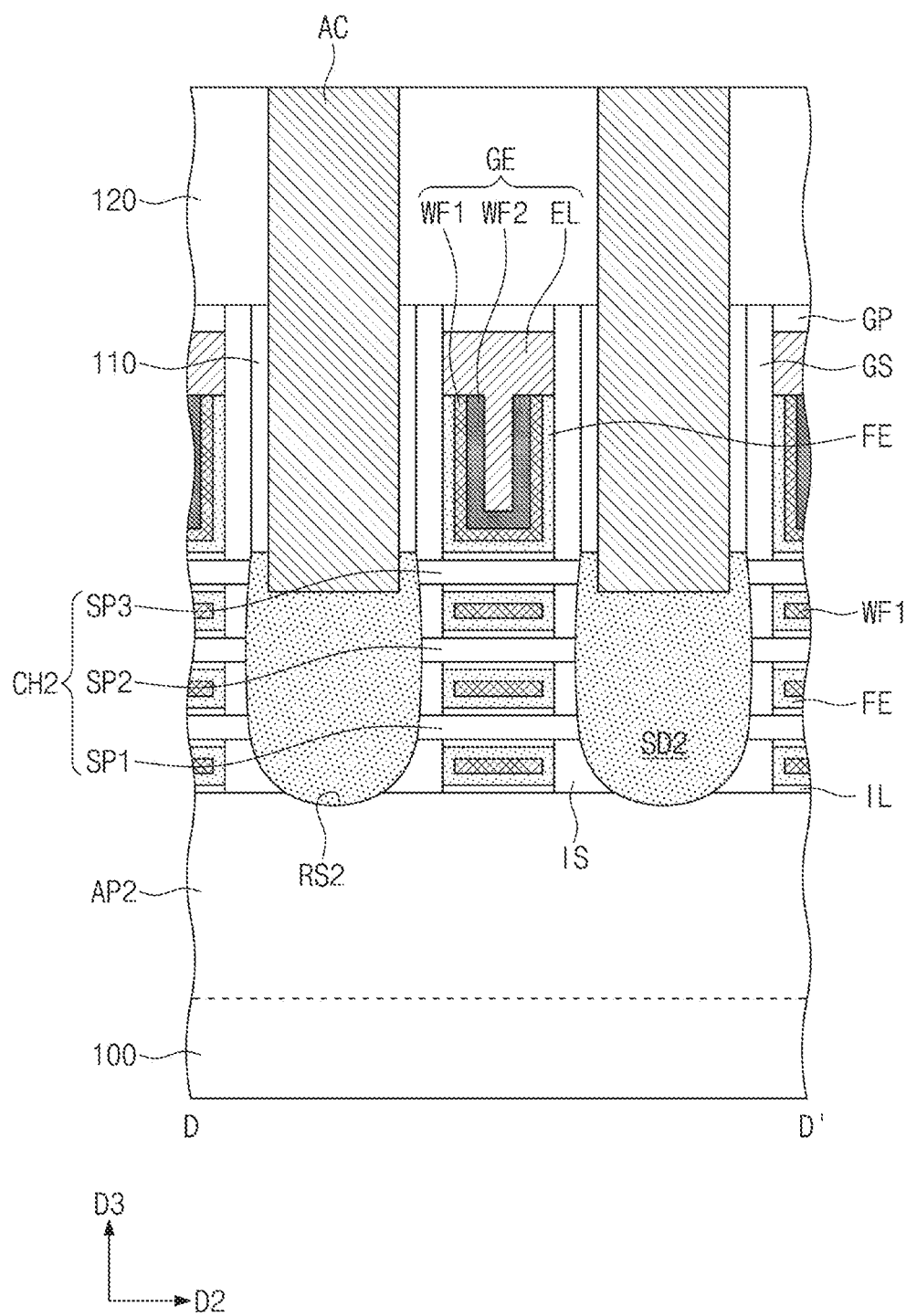
Figure 2E:
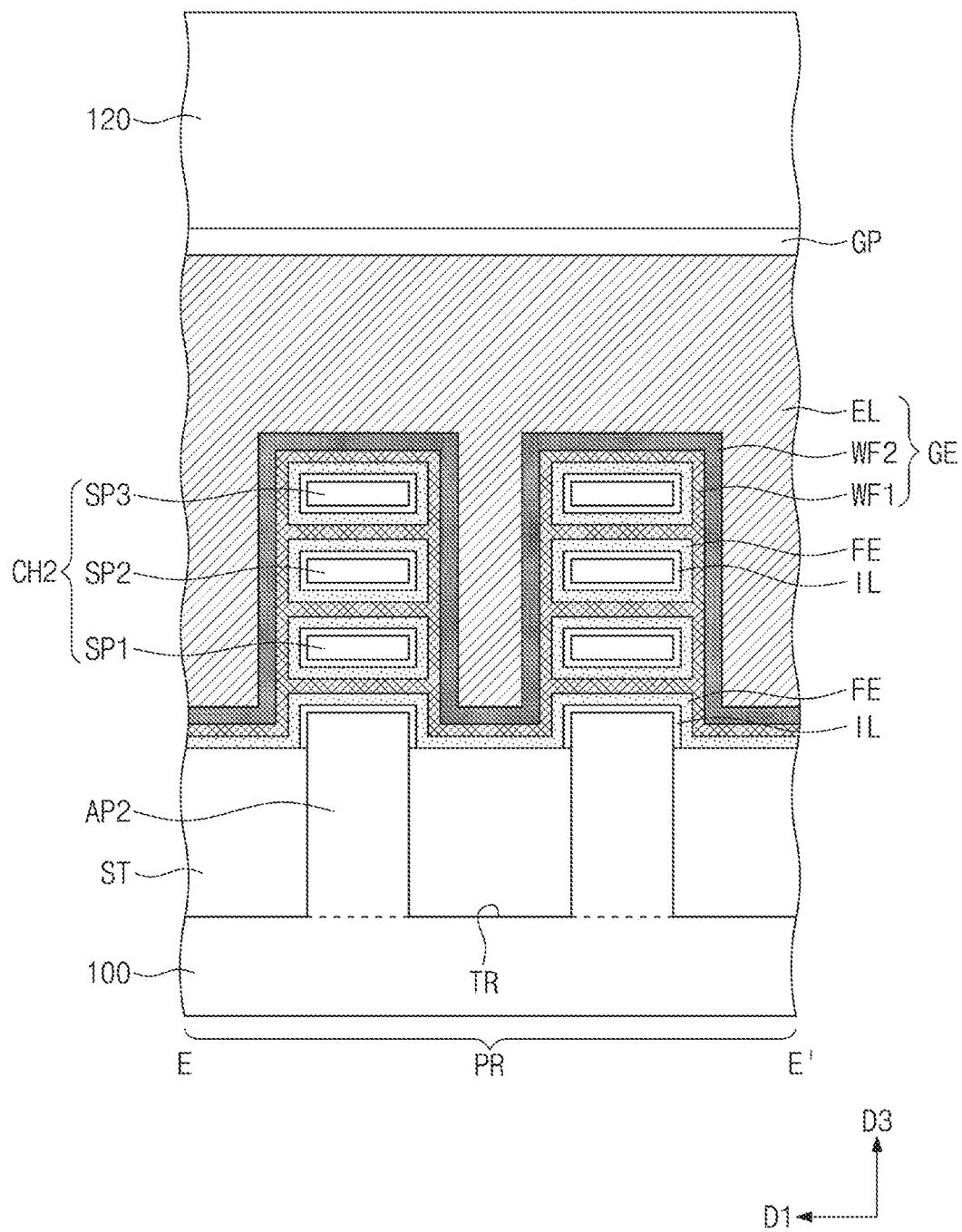
Figure 2F:
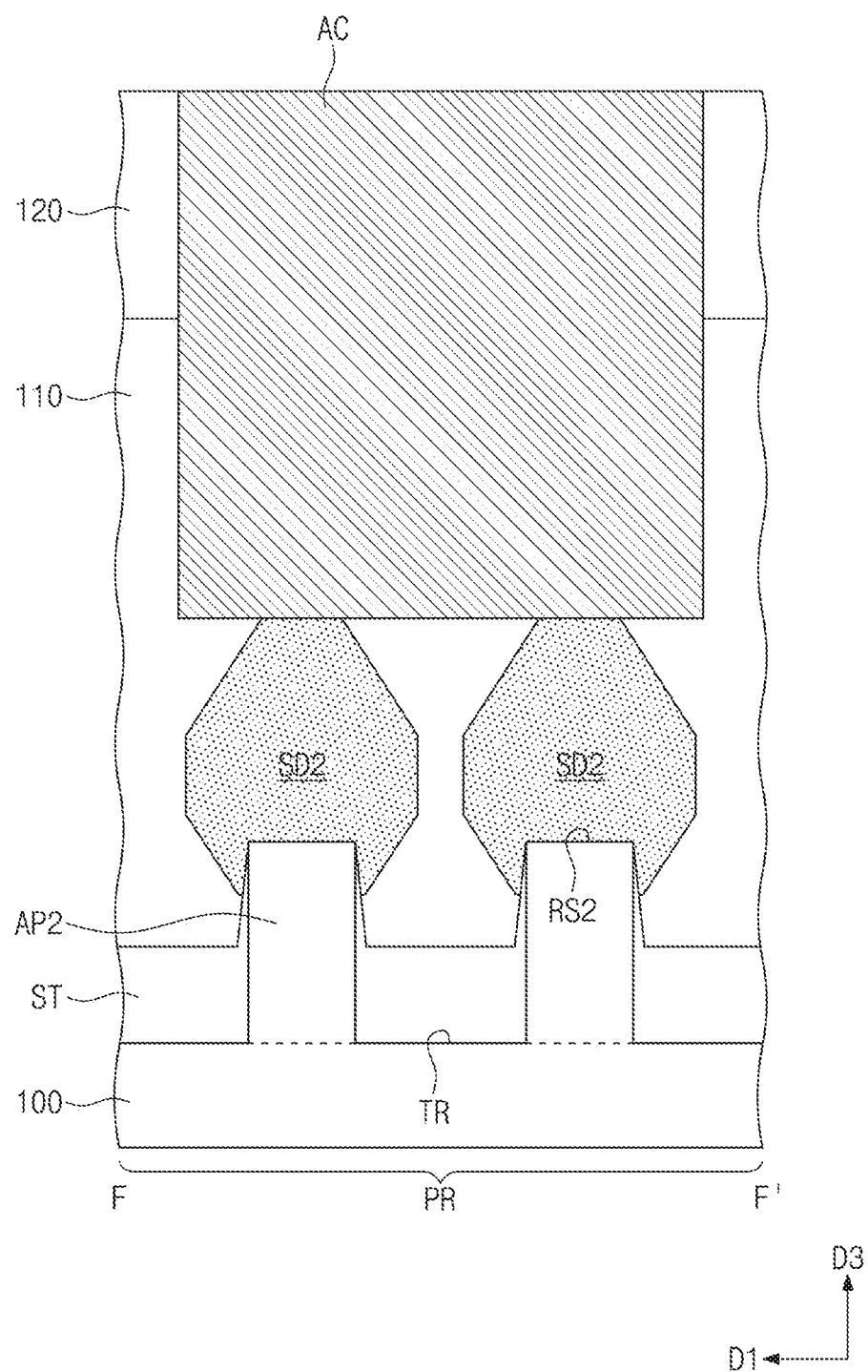

The first work function metal pattern WF1 may surround each of the first, second, and third semiconductor patterns SP1, SP2, and SP3 (see FIGS. 2B and 2E). For example, the first work function metal pattern WF1 may surround top and bottom surfaces and opposite sidewalls of each of the first, second, and third semiconductor patterns SP1, SP2, and SP3. In this sense, the first and second transistors according to the present inventive concepts may be gate-all-around field effect transistors. It will be understood that "an element A surrounds an element B" (or similar language) as used herein means that the element A is at least partially around the element B but does not necessarily mean that the element A completely encloses the element B.

An interface layer IL may be provided to surround each of the first, second, and third semiconductor patterns SP1, SP2, and SP3. The interface layer IL may directly cover (e.g., contact) the first, second, and third semiconductor patterns SP1, SP2, and SP3. The interface layer IL may cover an upper portion of the first active pattern AP1, and the upper portion of the first active pattern AP1 may vertically protrude from the device isolation layer ST. The interface layer IL may cover an upper portion of the second active pattern AP2, and the upper portion of the second active pattern AP2 may vertically protrude from the device isolation layer ST. The interface layer IL may not cover the top surface of the device isolation layer ST. For example, the interface layer IL may include a silicon oxide layer.

A ferroelectric pattern FE may be provided between the first work function metal pattern WF1 and each of the first, second, and third semiconductor patterns SP1, SP2, and SP3. The ferroelectric pattern FE may surround each of the first, second, and third semiconductor patterns SP1, SP2, and SP3. The ferroelectric pattern FE may be interposed between the first work function metal pattern WF1 and the upper portion of the first active pattern AP1. The ferroelectric pattern FE may be interposed between the first work function metal pattern WF1 and the upper portion of the second active pattern AP2. The ferroelectric pattern FE may be interposed between the device isolation layer ST and the first work function metal pattern WF1.

According to the present inventive concepts, the ferroelectric pattern FE may serve as a negative capacitor. For example, when the ferroelectric pattern FE is supplied with an external voltage, there may be the occurrence of a negative capacitance effect caused by a phase change, from an initial polarization state to a different polarization state, resulting from migration of dipoles in the ferroelectric pattern FE. In this case, a transistor including the ferroelectric pattern FE according to the present inventive concepts may have an increased overall capacitance, and accordingly may improve sub-threshold swing characteristics and may reduce operating voltage.

The ferroelectric pattern FE may include hafnium oxide doped with (or containing) one or more of zirconium (Zr), silicon (Si), aluminum (Al), and lanthanum (La). Because hafnium oxide is doped with one or more of zirconium (Zr), silicon (Si), aluminum (Al), and lanthanum (La) at a certain ratio, at least a portion of the ferroelectric pattern FE may have an orthorhombic crystal structure. When at least a portion of the ferroelectric pattern FE has the orthorhombic crystal structure, the negative capacitance effect may occur. A portion having the orthorhombic crystal structure may have a volume ratio of about 10% to about 50% in the ferroelectric pattern FE.

When the ferroelectric pattern FE includes zirconium-doped hafnium oxide (ZrHfO), a ratio of zirconium (Zr) atoms to zirconium (Zr) and hafnium (Hf) atoms, or a ratio of Zr/(Zr+Hf), may fall within a range from about 45 at % to about 55 at %. When the ferroelectric pattern FE includes silicon-doped hafnium oxide (SiHfO), a ratio of silicon (Si) atoms to silicon (Si) and hafnium (Hf) atoms, or a ratio or Si/(Si+Hf), may fall within a range from about 4 at % to about 6 at %. When the ferroelectric pattern FE includes aluminum-doped hafnium oxide (AlHfO), a ratio of aluminum (Al) atoms to aluminum (Al) and hafnium (Hf) atoms, or a ratio of Al/(Al+Hf), may fall within a range from about 5 at % to about 10 at %. When the ferroelectric pattern FE includes lanthanum-doped hafnium oxide (LaHfO), a ratio of lanthanum (La) atoms to lanthanum (La) and hafnium (Hf) atoms, or a ratio of La/(La+Hf), may fall within a range from about 5 at % to about 10 at %.

A first space SA1 may be defined between the first and second semiconductor patterns SP1 and SP2 of the first channel pattern CH1. For example, the first space SA1 may be defined between a pair of vertically adjacent ones of the first, second, and third semiconductor patterns SP1, SP2, and SP3.

The first space SA1 may be filled with the interface layer IL, the ferroelectric pattern FE, and the first work function metal pattern WF1. The ferroelectric pattern FE may conformally fill the first space SA1. The first work function metal pattern WF1 may completely fill a remaining portion of the first space SA1 that are not occupied by the interface layer IL and the ferroelectric pattern FE. Neither the second work function metal pattern WF2 nor the electrode pattern EL may fill the first space SA1. In some embodiments, the ferroelectric pattern FE may extend on the interface layer IL with a uniform thickness, and the first work function metal pattern WF1 may fill a space between the ferroelectric patterns FE, as illustrated in FIG. 2B.

A second space SA2 may be defined on the third semiconductor pattern SP3, or an uppermost semiconductor pattern of the first channel pattern CH1. The second space SP2 may be a cavity surrounded by the third semiconductor pattern SP3, a pair of gate spacers GS which will be discussed below, and a gate capping pattern GP which also will be discussed below.

The second space SA2 may be filled with the interface layer IL, the ferroelectric pattern FE, the first work function metal pattern WF1, the second work function metal pattern WF2, and the electrode pattern EL. The interface layer IL, the ferroelectric pattern FE, the first work function metal pattern WF1, the second work function metal pattern WF2, and the electrode pattern EL may be sequentially stacked in the second space SA2.

A pair of gate spacers GS may be disposed on opposite sidewalls of each of the gate electrodes GE. The gate spacers GS may extend in the first direction D1 along the gate electrode GE. The gate spacers GS may have their top surfaces higher than that of the gate electrode GE. For example, the gate spacers GS may include one or more of SiCN, SiCON, and SiN. In some embodiments, the gate spacers GS may include multiple layers including two or more of SiCN, SiCON, and SiN.

A gate capping pattern GP may be provided on each of the gate electrodes GE. The gate capping pattern GP may extend in the first direction D1 along the gate electrode GE. The gate capping pattern GP may have a top surface coplanar with those of the gate spacers GS. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

On the PMOSFET region PR, the ferroelectric pattern FE may contact the first source/drain pattern SD1 (see FIG. 2A). For example, the ferroelectric pattern FE may be interposed between the gate electrode GE and the first source/drain pattern SD1.

On the NMOSFET region NR, an inner spacer IS may be interposed between the second source/drain pattern SD2 and the gate electrode GE (see FIG. 2D). The inner spacer IS may be interposed between vertically spaced ones of the first, second, and third semiconductor patterns SP1, SP2, and SP3. On the NMOSFET region NR, the ferroelectric pattern FE may contact the inner spacer IS. For example, the ferroelectric pattern FE may be interposed between the gate electrode GE and the inner spacer IS. The inner spacer IS may include, for example, a silicon nitride layer.

A thickness of the first work function metal pattern WF1 of the gate electrode GE on the PMOSFET region PR may be different from that of the first work function metal pattern WF1 of the gate electrode GE on the NMOSFET region NR, and a thickness of the second work function metal pattern WF2 of the gate electrode GE on the PMOSFET region PR may be different from that of the second work function metal pattern WF2 of the gate electrode GE on the NMOSFET region NR. For example, the thickness of the first work function metal pattern WF1 of the gate electrode GE on the PMOSFET region PR may be greater than the thickness of the first work function metal pattern WF1 of the gate electrode GE on the NMOSFET region NR. The thickness of the second work function metal pattern WF2 of the gate electrode GE on the PMOSFET region PR may be less than the thickness of the second work function metal pattern WF2 of the gate electrode GE on the NMOSFET region NR.

A first interlayer dielectric layer 110 may be provided on an entire surface of the substrate 100. The first interlayer dielectric layer 110 may cover the device isolation layer ST, the gate spacers GS, and the first and second source/drain patterns SD1 and SD2. The first interlayer dielectric layer 110 may have a top surface substantially coplanar with that of the gate capping pattern GP. A second interlayer dielectric layer 120 may be provided on the first interlayer dielectric layer 110. For example, the first and second interlayer dielectric layers 110 and 120 may include a silicon oxide layer or a silicon oxynitride layer.

Active contacts AC may be provided to penetrate (e.g., extend through) the first and second interlayer dielectric layers 110 and 120 and to have connection with the first and second source/drain patterns SD1 and SD2. For example, the active contacts AC may include a metallic material (e.g., titanium, tantalum, tungsten, copper and/or aluminum). As used herein the term "and/or" includes any and all combinations of one or more of the associated listed items.

Figure 11:
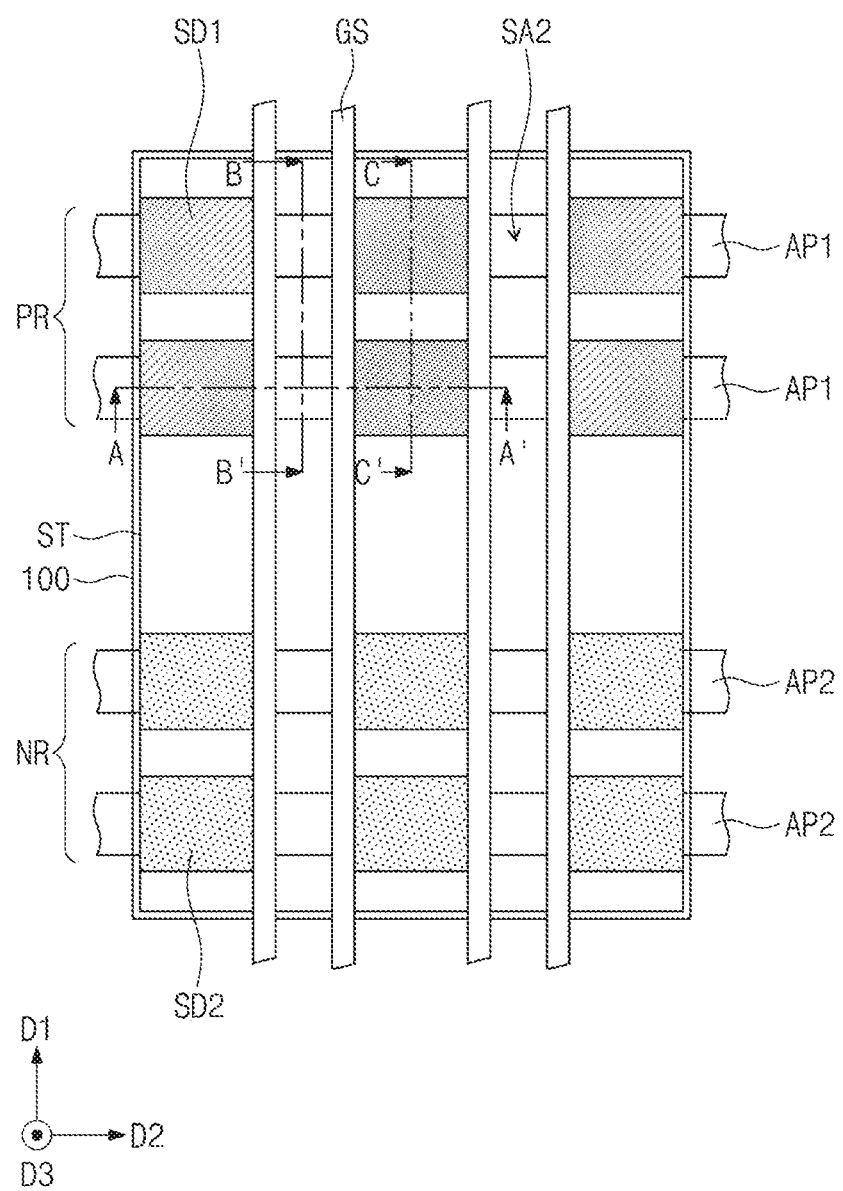
Figure 13:
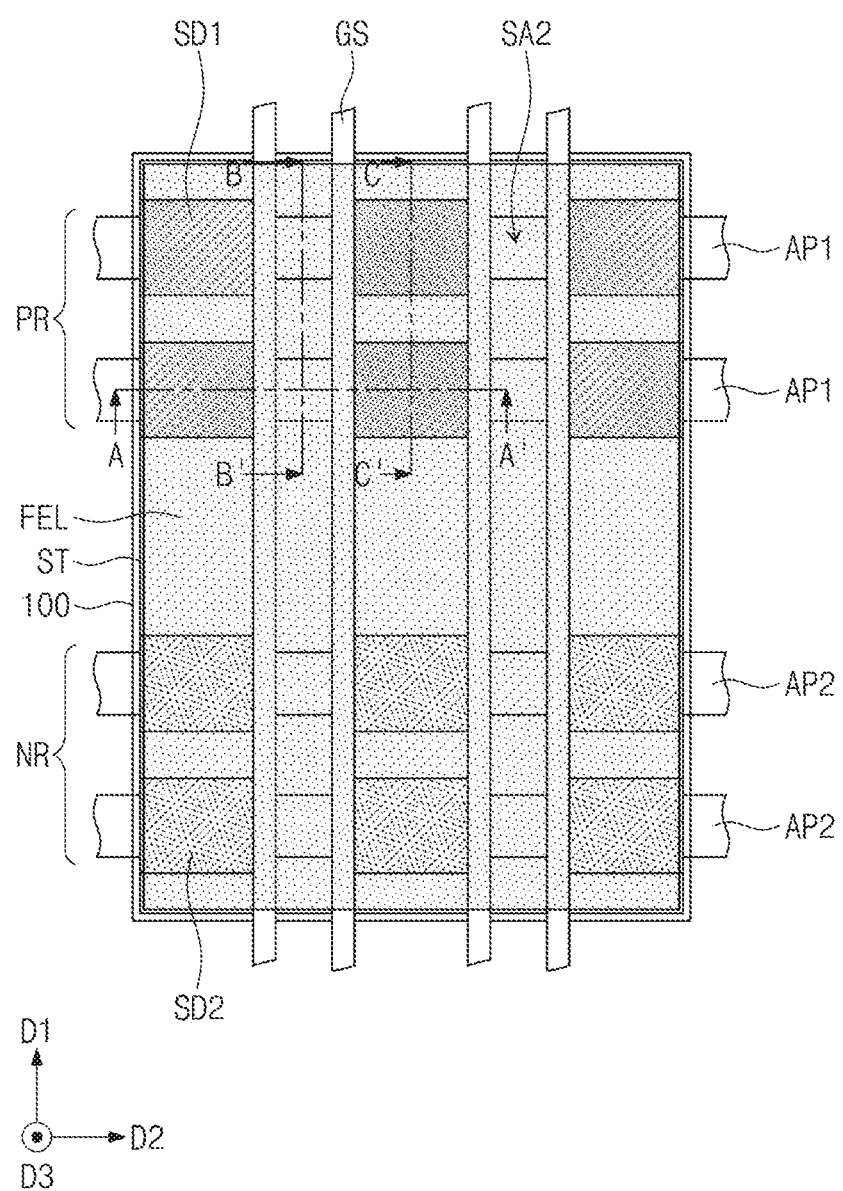

According to some example embodiments of the present inventive concepts, the ferroelectric pattern FE may be provided between the gate electrode GE and each of the first and second channel patterns CH1 and CH2. The ferroelectric pattern FE may include the orthorhombic crystal structure and thus may produce the negative capacitance effect. Consequently, a transistor may show improved sub-threshold swing characteristics and may have lower operating voltage. It will be understood that the first and second interlayer dielectric layers 110 and 120 are not shown in some plan views (e.g., FIGS. 1, 11, and 13) to show underlying structures.

Figure 10A:
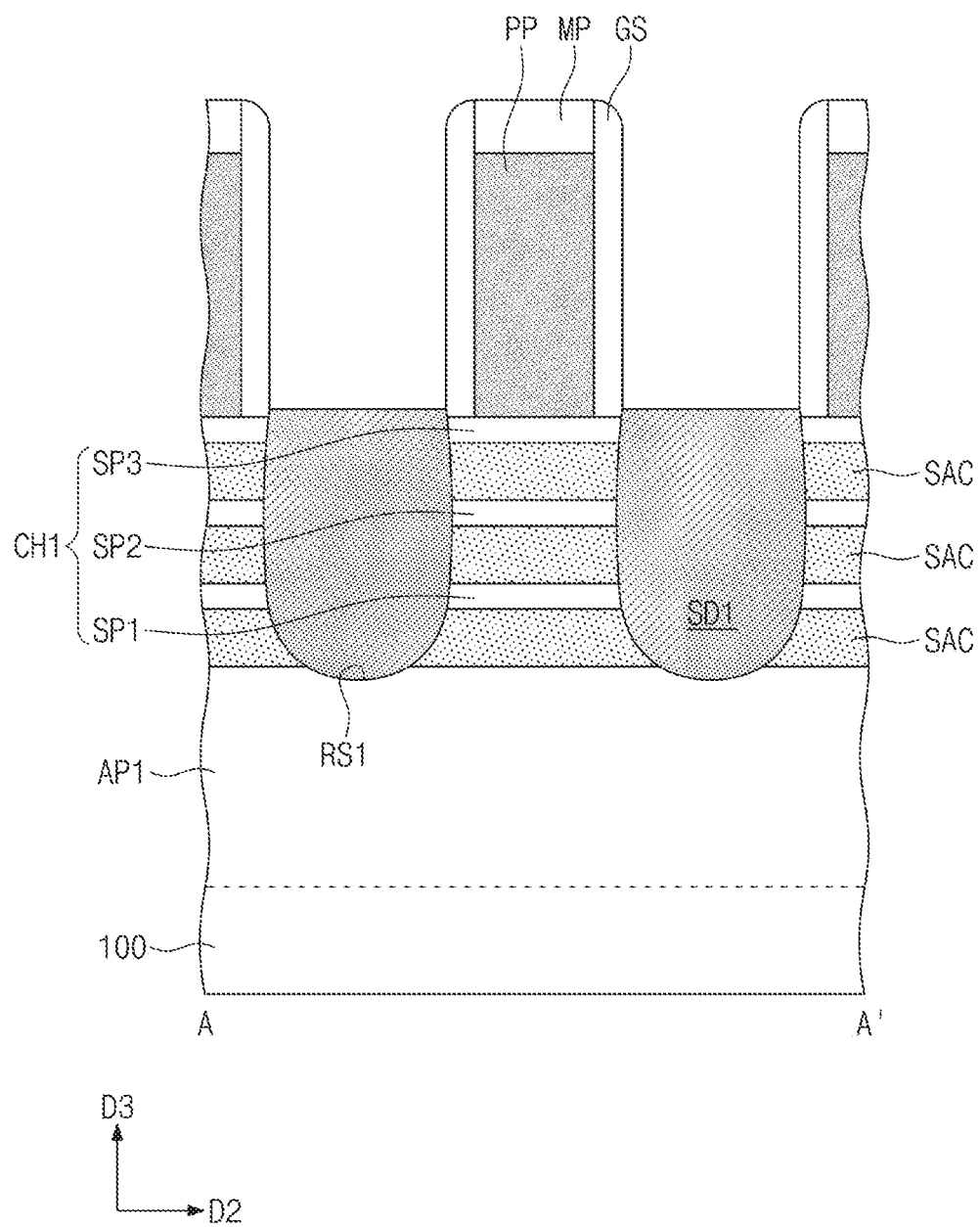
Figure 10B:
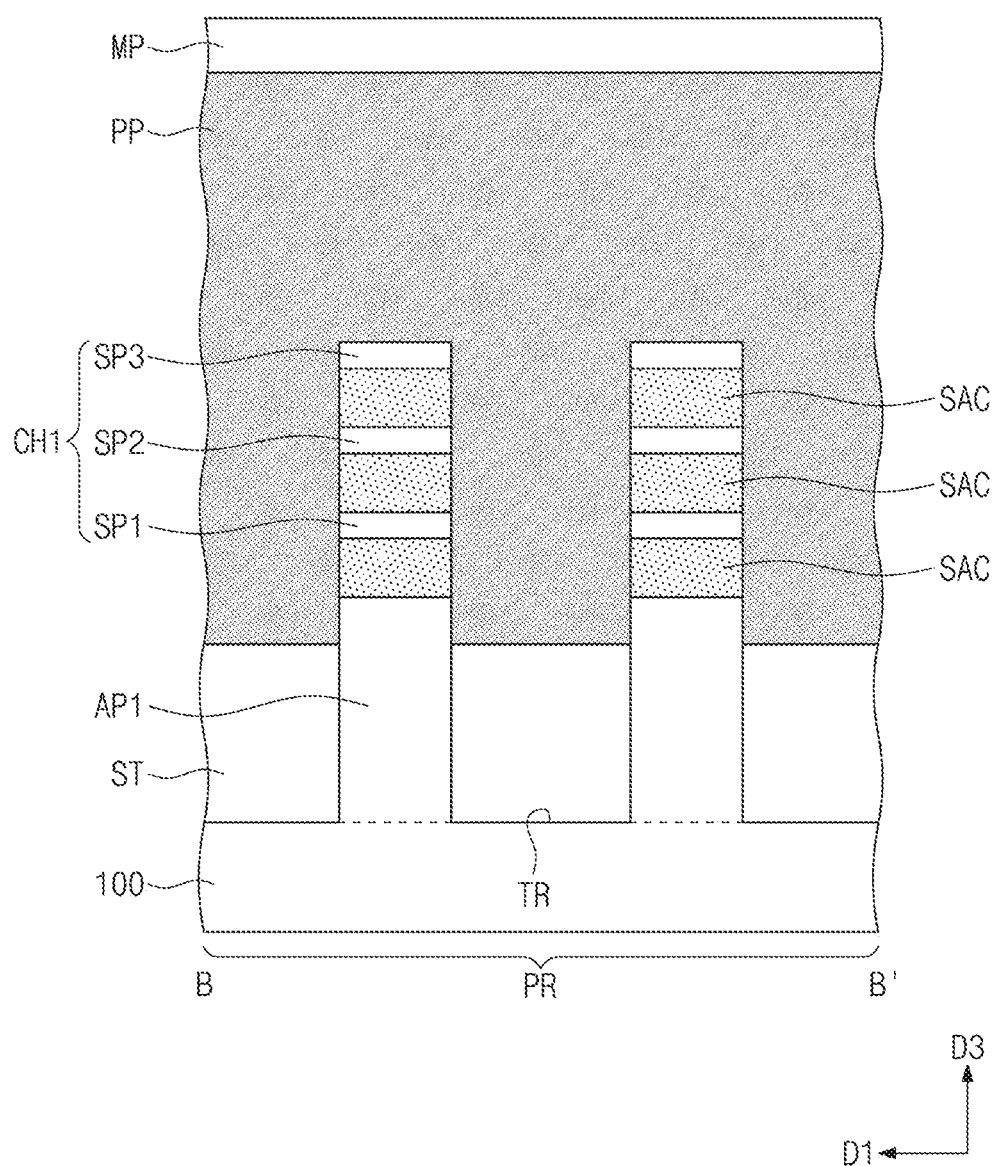
Figure 10C:
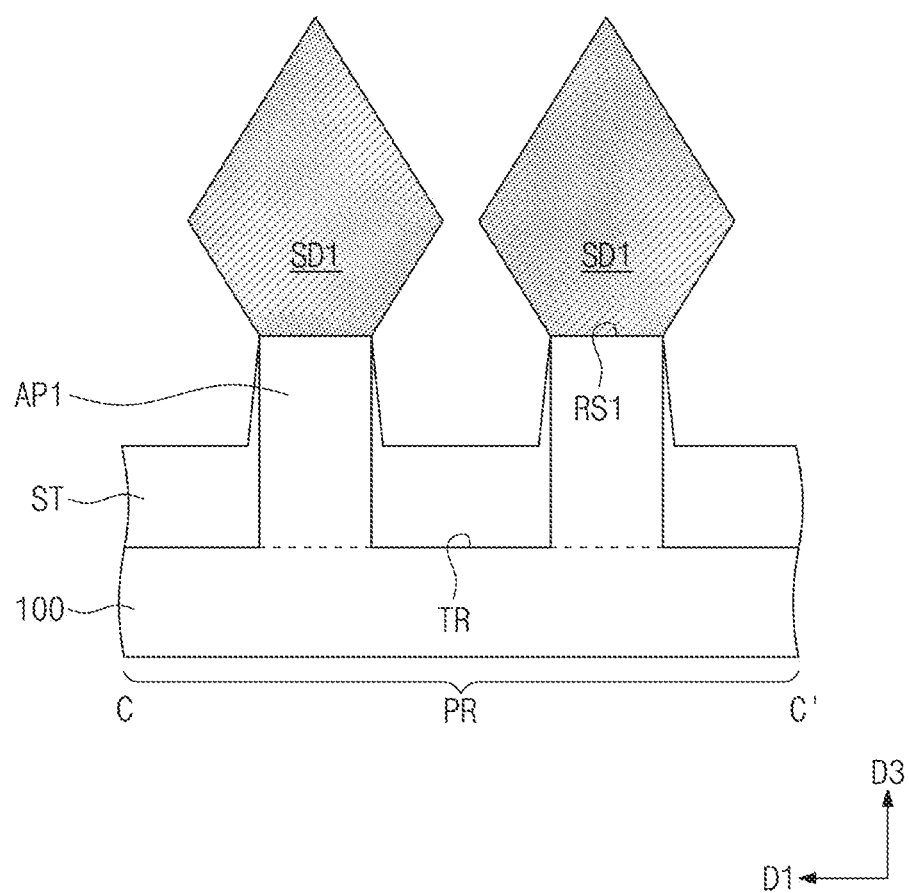
FIGS. 10C, 12C, and 14C illustrate cross-sectional views taken along line C-C' of FIGS. 9, 11, and 13, respectively.
Figure 12A:
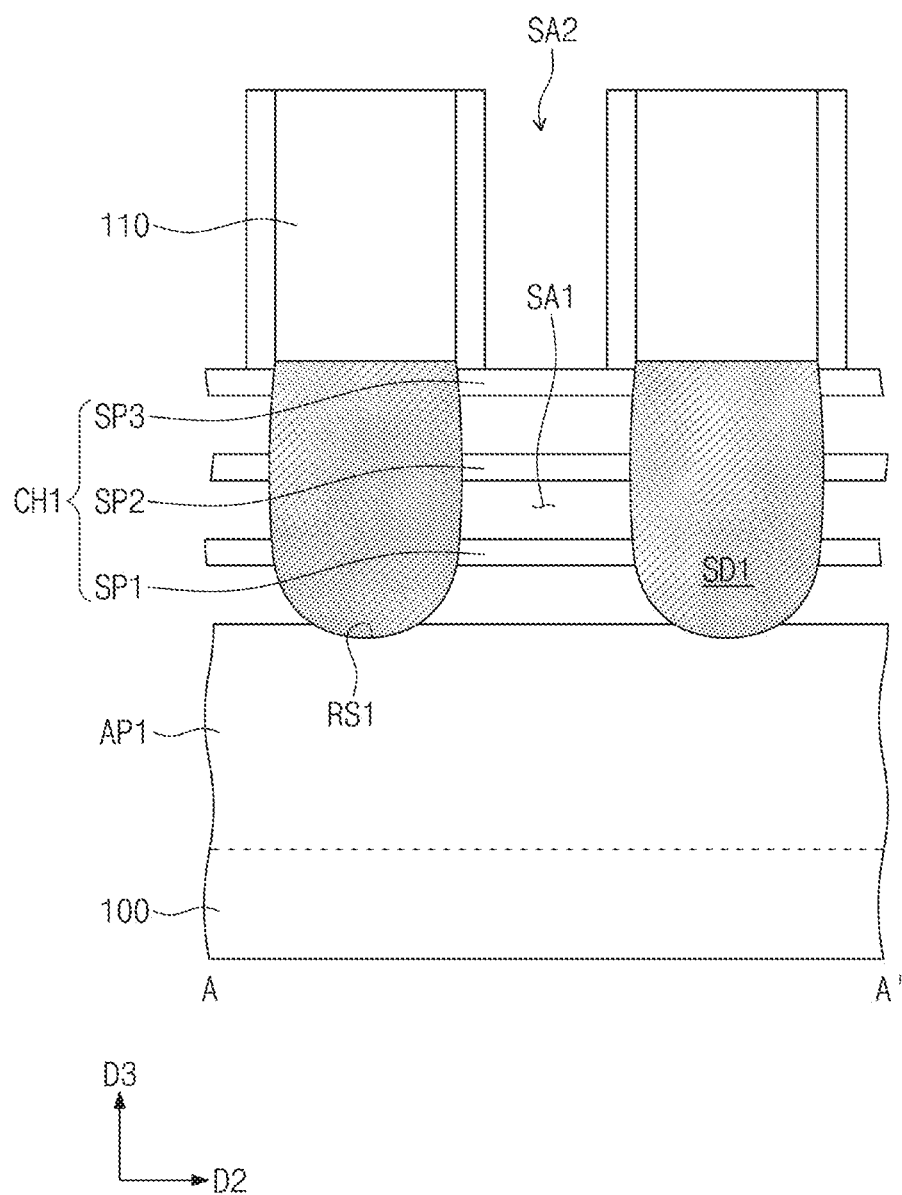
Figure 12B:
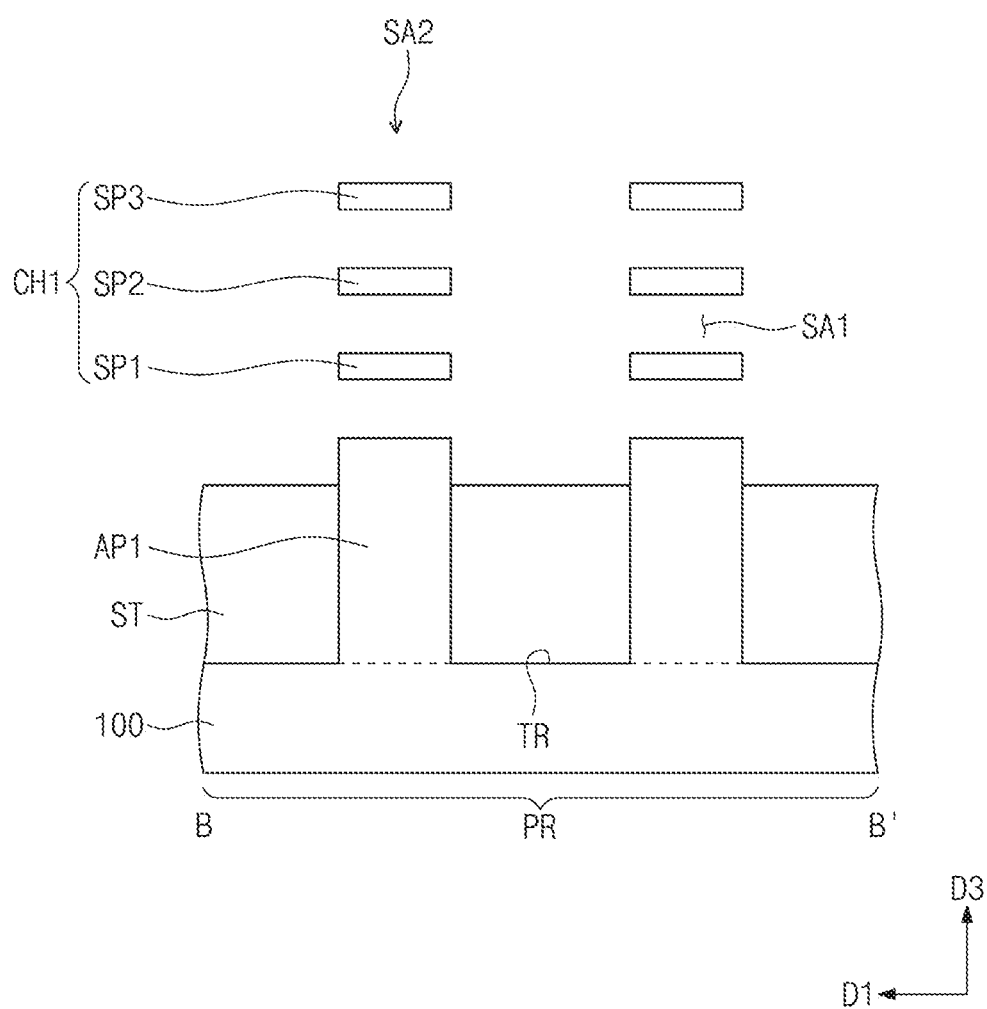
Figure 12C:
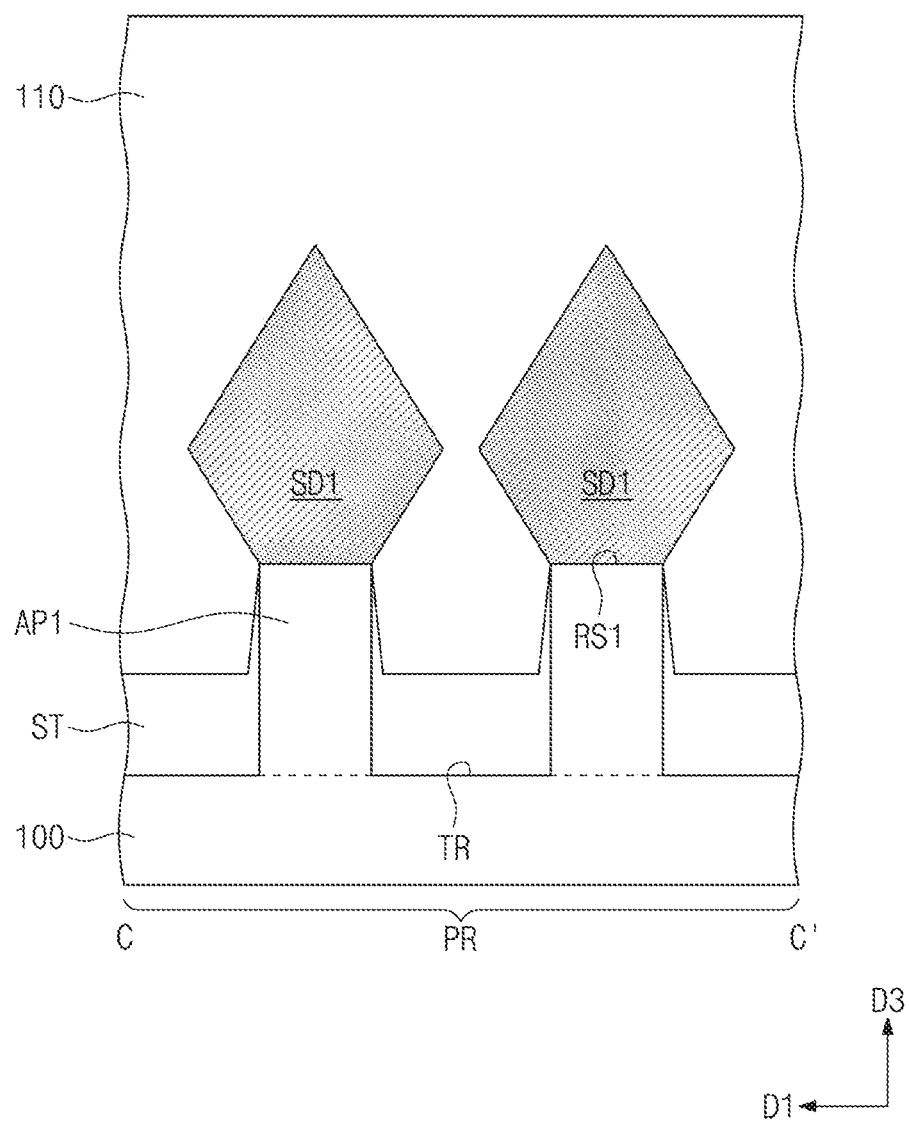
Figure 14A:
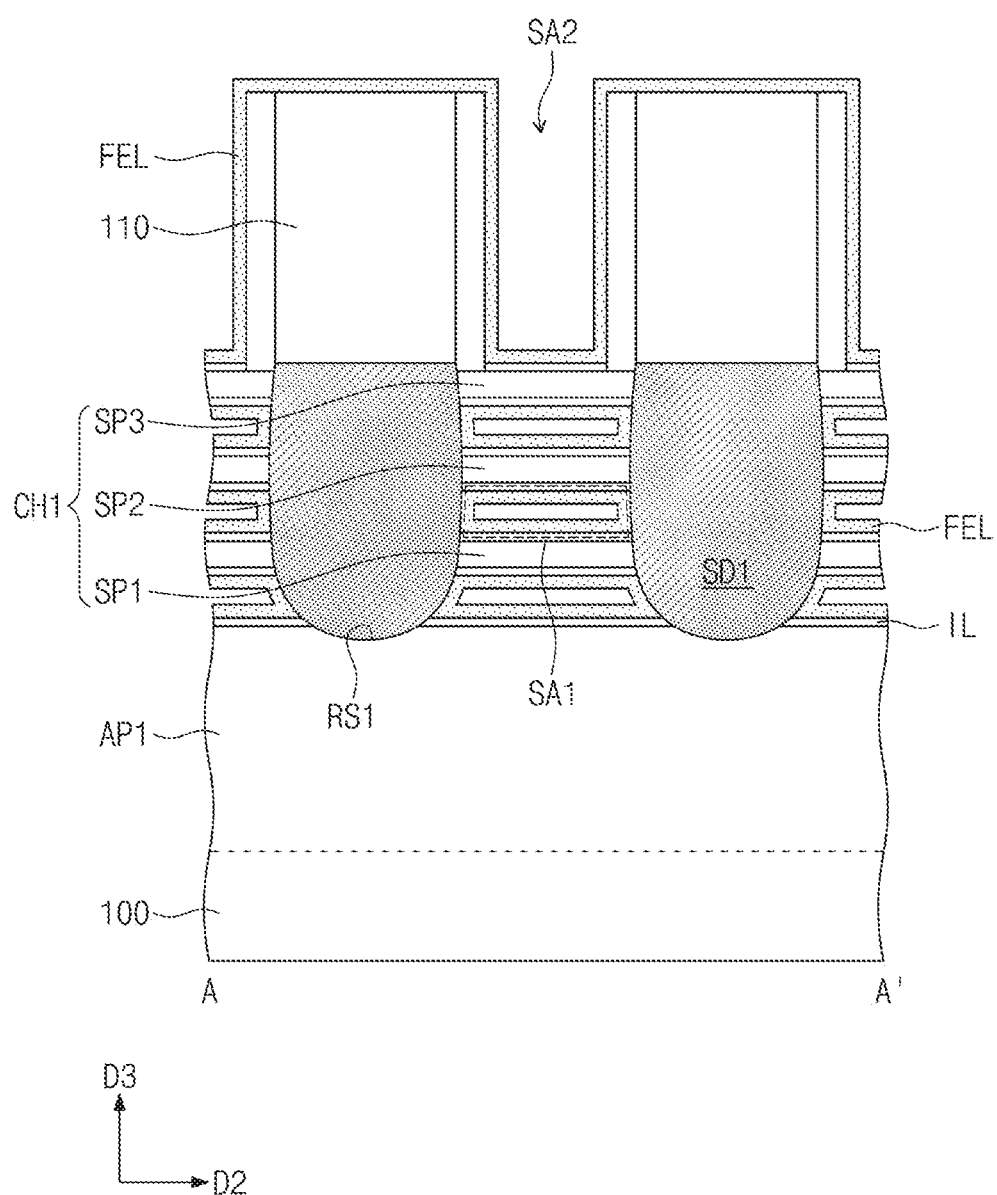
Figure 14B:
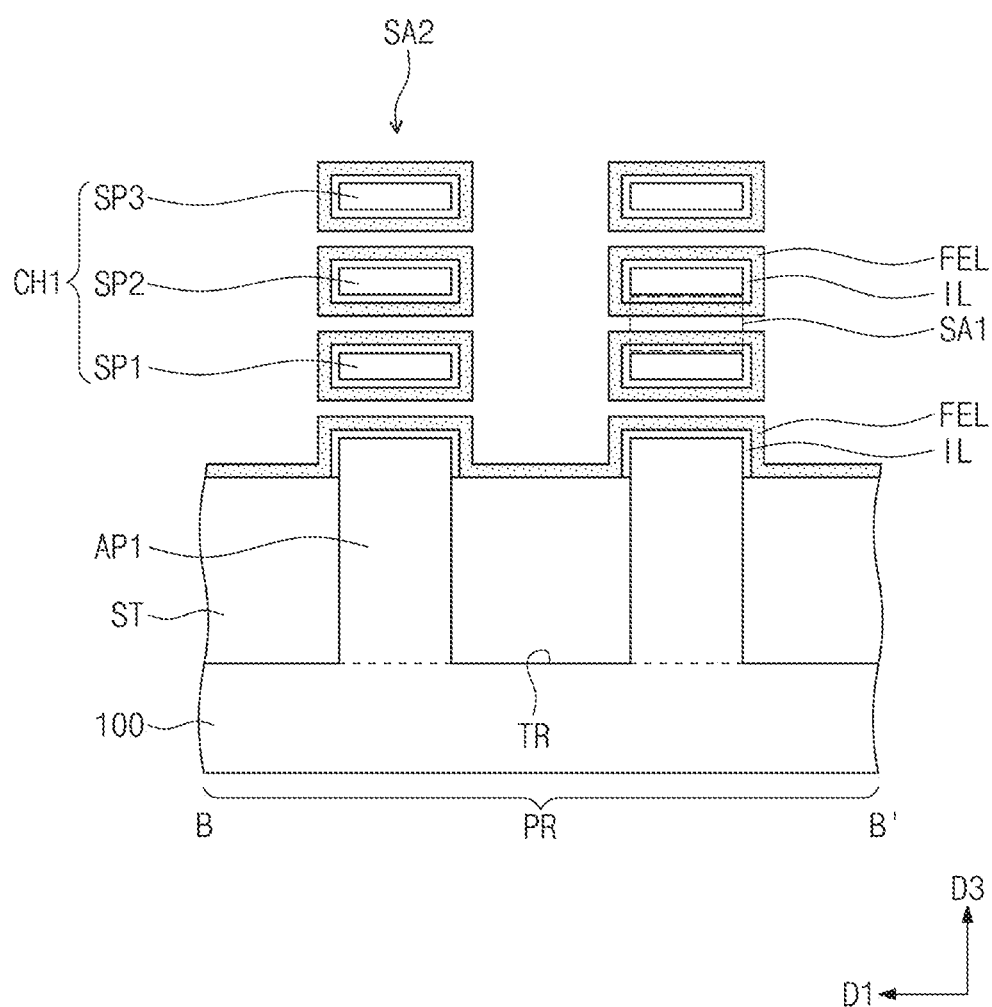
Figure 14C:
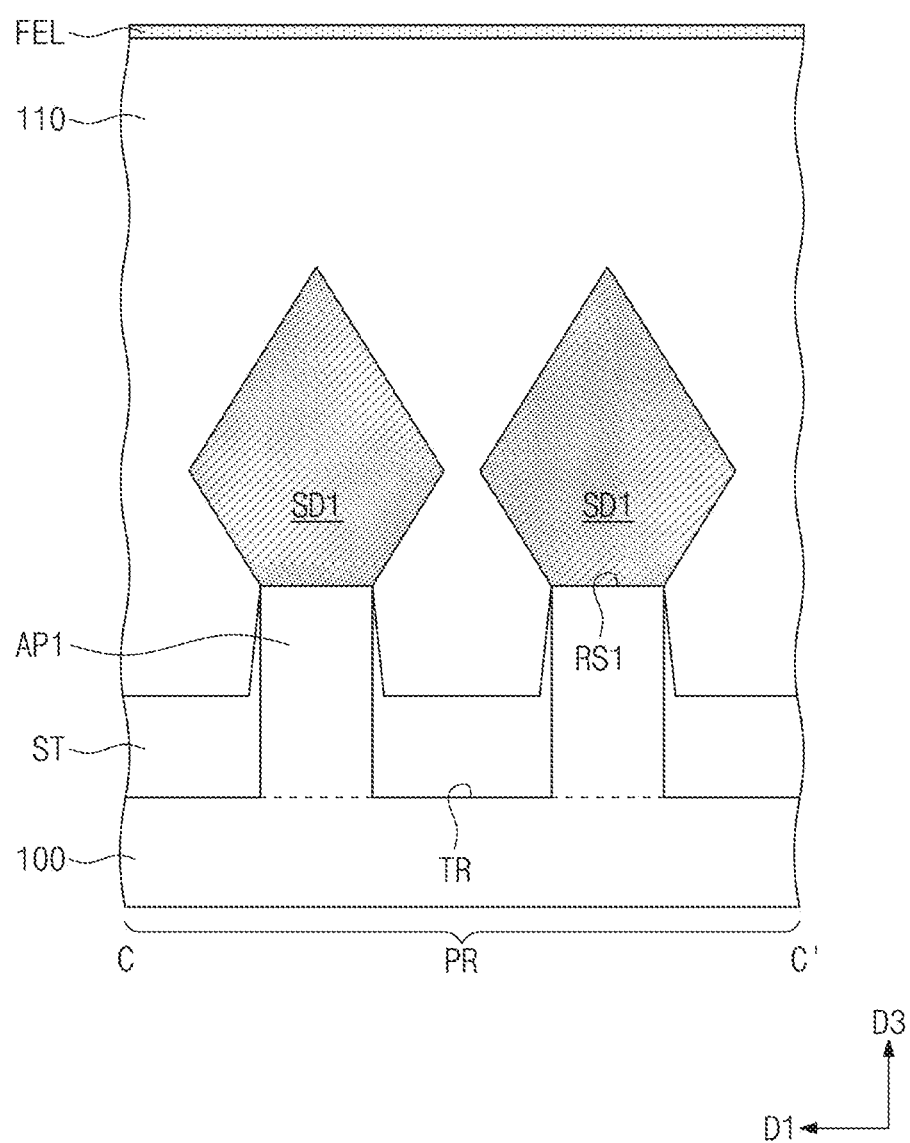

FIGS. 3, 5, 7, 9, 11, and 13 illustrate plan views showing a method of fabricating a semiconductor device according to some example embodiments of the present inventive concepts. FIGS. 4, 6A, 8A, 10A, 12A, and 14A illustrate cross-sectional views taken along line A-A' of FIGS. 3, 5, 7, 9, 11, and 13, respectively. FIGS. 6B, 8B, 10B, 12B, and 14B illustrate cross-sectional views taken along line B-B' of FIGS. 5, 7, 9, 11, and 13, respectively. FIGS. 10C, 12C, and 14C illustrate cross-sectional views taken along line C-C' of FIGS. 9, 11, and 13, respectively.

Figure 3:
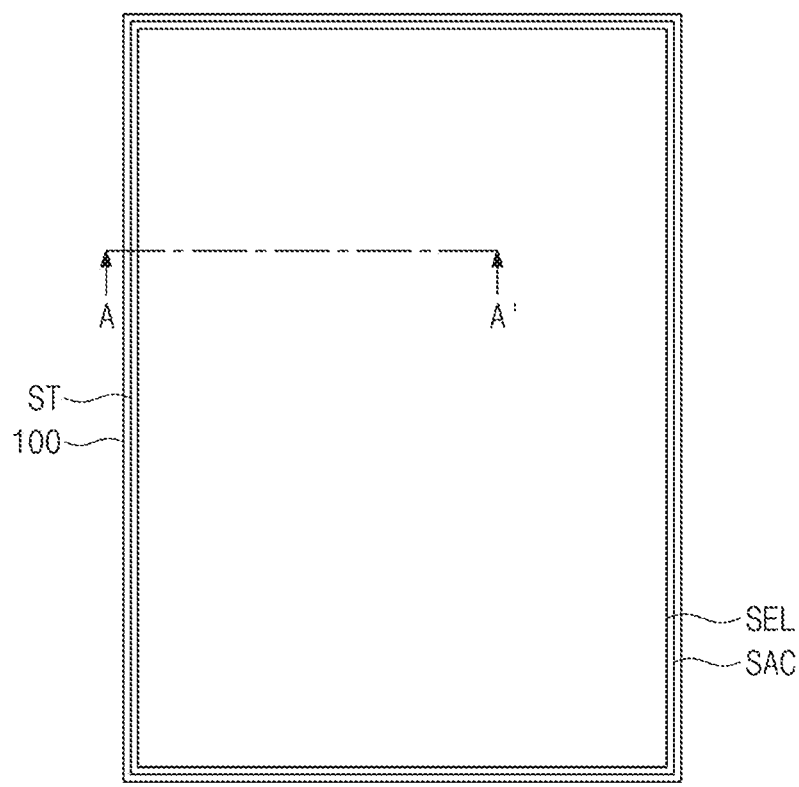
FIGS. 3, 5, 7, 9, 11, and 13 illustrate plan views showing a method of fabricating a semiconductor device according to some example embodiments of the present inventive concepts.
Figure 3:
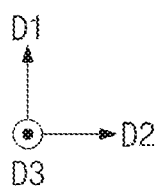
Figure 4:
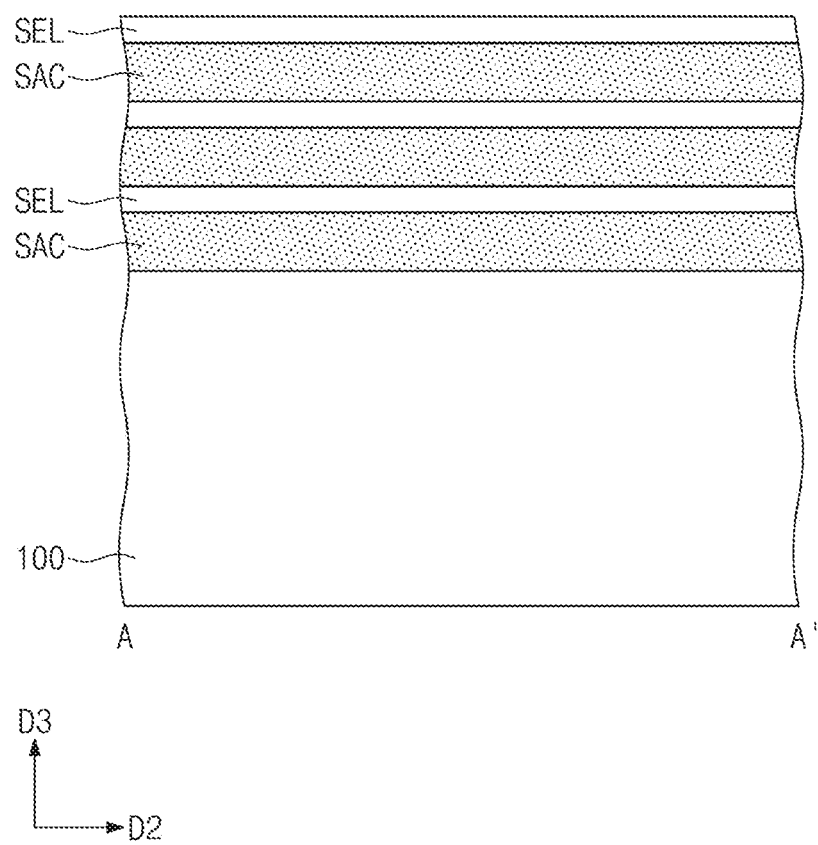
FIGS. 4, 6A, 8A, 10A, 12A, and 14A illustrate cross-sectional views taken along line A-A' of FIGS. 3, 5, 7, 9, 11, and 13, respectively.

Referring to FIGS. 3 and 4, sacrificial layers SAC and semiconductor layers SEL may be alternately and repeatedly stacked on a substrate 100 (e.g., an entire surface of a substrate 100). The semiconductor layers SEL may be repeatedly stacked three times, but the present inventive concepts are not limited thereto. The sacrificial layers SAC may include, for example, a material having an etch selectivity with respect to the semiconductor layers SEL. In this sense, the semiconductor layers SEL may include a material that substantially cannot be etched in a process in which the sacrificial layers SAC are etched. In some embodiments, in a process in which the sacrificial layers SAC are etched, an etch-rate ratio of the sacrificial layers SAC to the semiconductor layers SEL may be in a range of about 10:1 to about 200:1. For example, the sacrificial layers SAC may include silicon-germanium (SiGe) or germanium (Ge), and the semiconductor layers SEL may include silicon (Si).

The sacrificial layers SAC may be formed thicker than the semiconductor layers SEL. The sacrificial layers SAC and the semiconductor layers SEL may be formed by an epitaxial growth process in which the substrate 100 is used as a seed layer. The sacrificial layers SAC and the semiconductor layers SEL may be successively formed in the same chamber. The sacrificial layers SAC and the semiconductor layers SEL may be conformally grown on the entire surface of the substrate 100.

Figure 5:
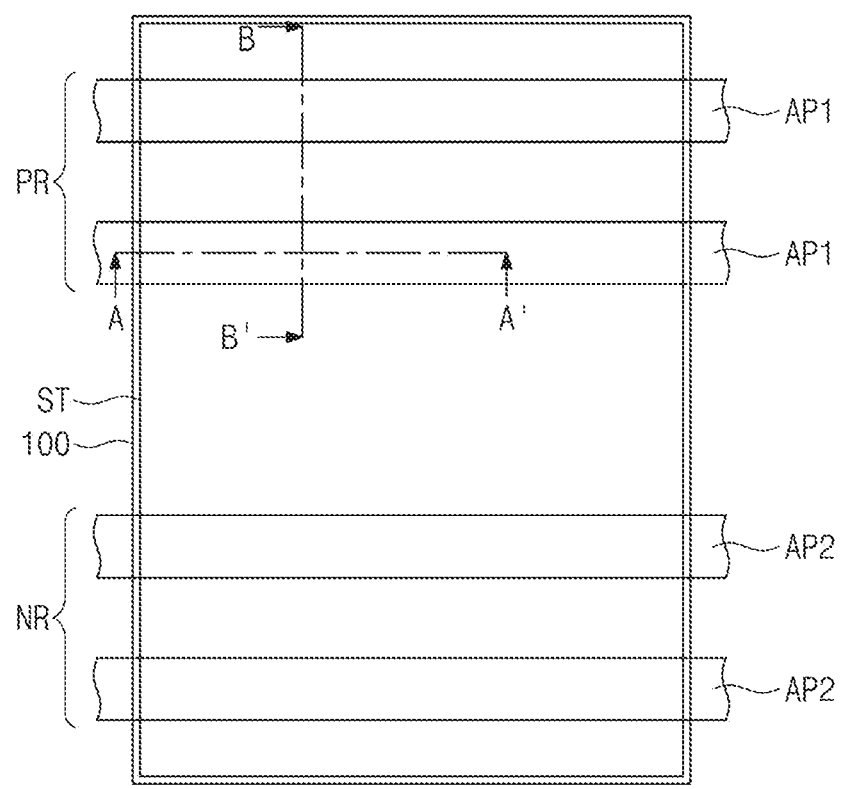
Figure 5:
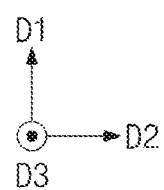
Figure 6A:
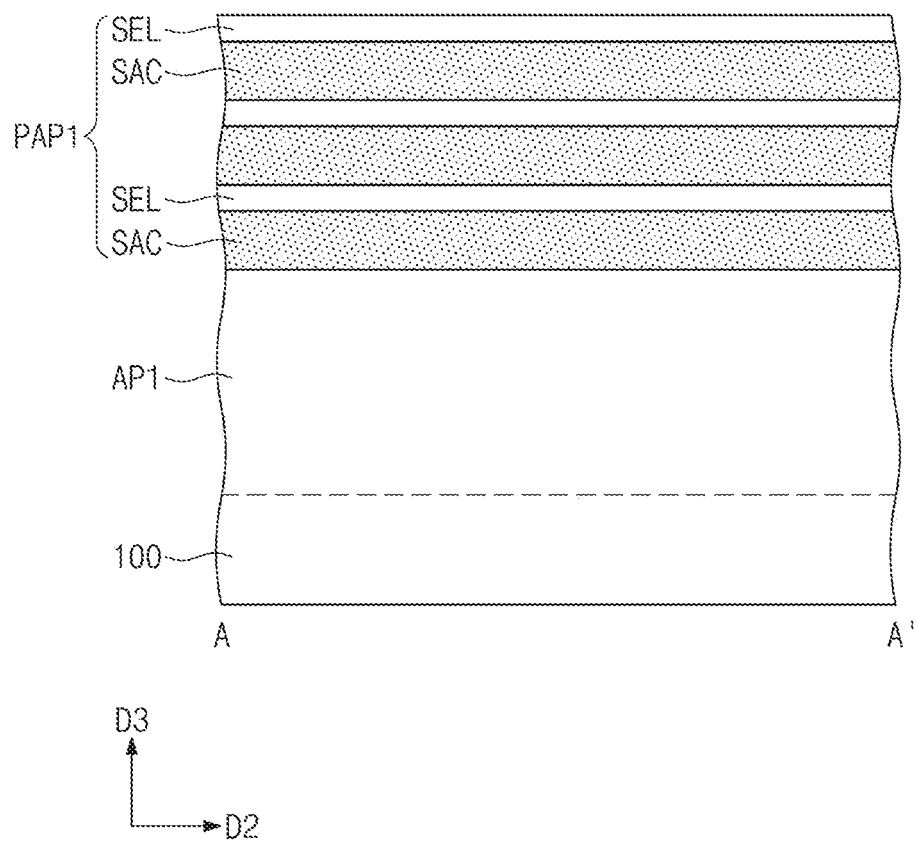
Figure 6B:
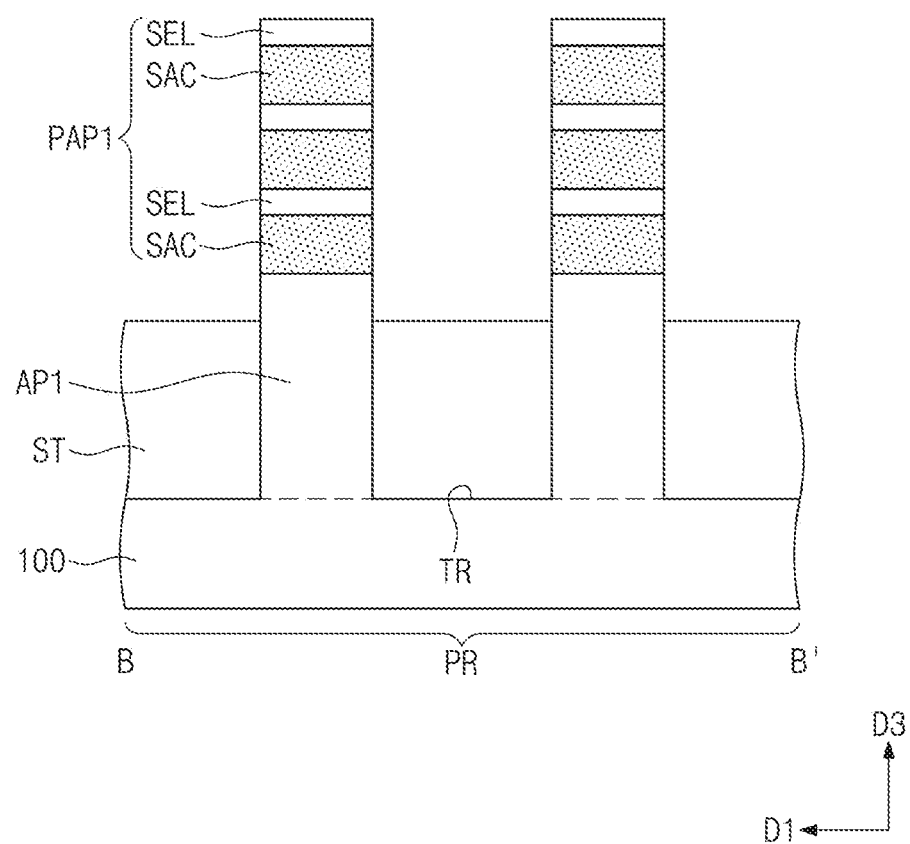
FIGS. 6B, 8B, 10B, 12B, and 14B illustrate cross-sectional views taken along line B-B' of FIGS. 5, 7, 9, 11, and 13, respectively.

The following will describe an example based on a PMOSFET region PR of the substrate 100. It will be understood that the method discussed with reference to the PMOSFET region PR may be used to form elements on an NMOSFET region NR. Referring to FIGS. 5, 6A, and 6B, the sacrificial layers SAC and the semiconductor layers SEL may be patterned to form a first preliminary pattern PAP1 on the PMOSFET region PR of the substrate 100. When the sacrificial layers SAC and the semiconductor layers SEL are patterned, an upper portion of the substrate 100 may be etched to form a trench TR defining first active patterns AP1.

The trench TR may extend in a second direction D2 and define a sidewall along the second direction D2 of each of the first active patterns AP1. For example, the trench TR may be formed between a pair of the first active patterns AP1 that are adjacent to a first direction D1.

The first preliminary pattern PAP1 may be disposed on the first active pattern AP1. The first preliminary pattern PAP1 may vertically overlap the first active pattern AP1. For example, the first preliminary pattern PAP1 may have a planar shape substantially the same as that of the first active pattern AP1. The first preliminary pattern PAP1 and the first active pattern AP1 may be formed to have a linear or bar shape extending in the second direction D2.

A device isolation layer ST may be formed to fill the trench TR. The formation of the device isolation layer ST may include forming a dielectric layer on the entire surface of the substrate 100 and recessing the dielectric layer to completely expose the first preliminary pattern PAP1. The device isolation layer ST may have a top surface lower than that of the first active pattern AP1.

Figure 7:
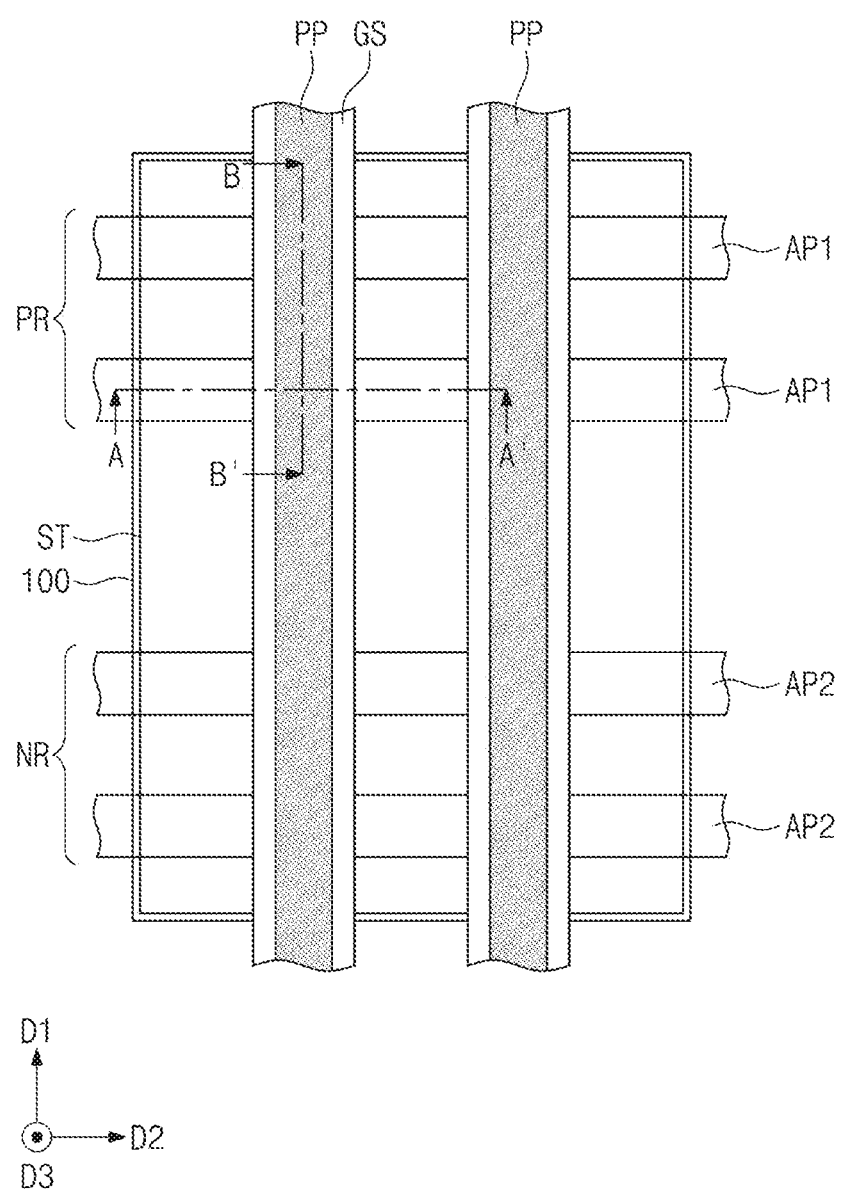
Figure 8A:
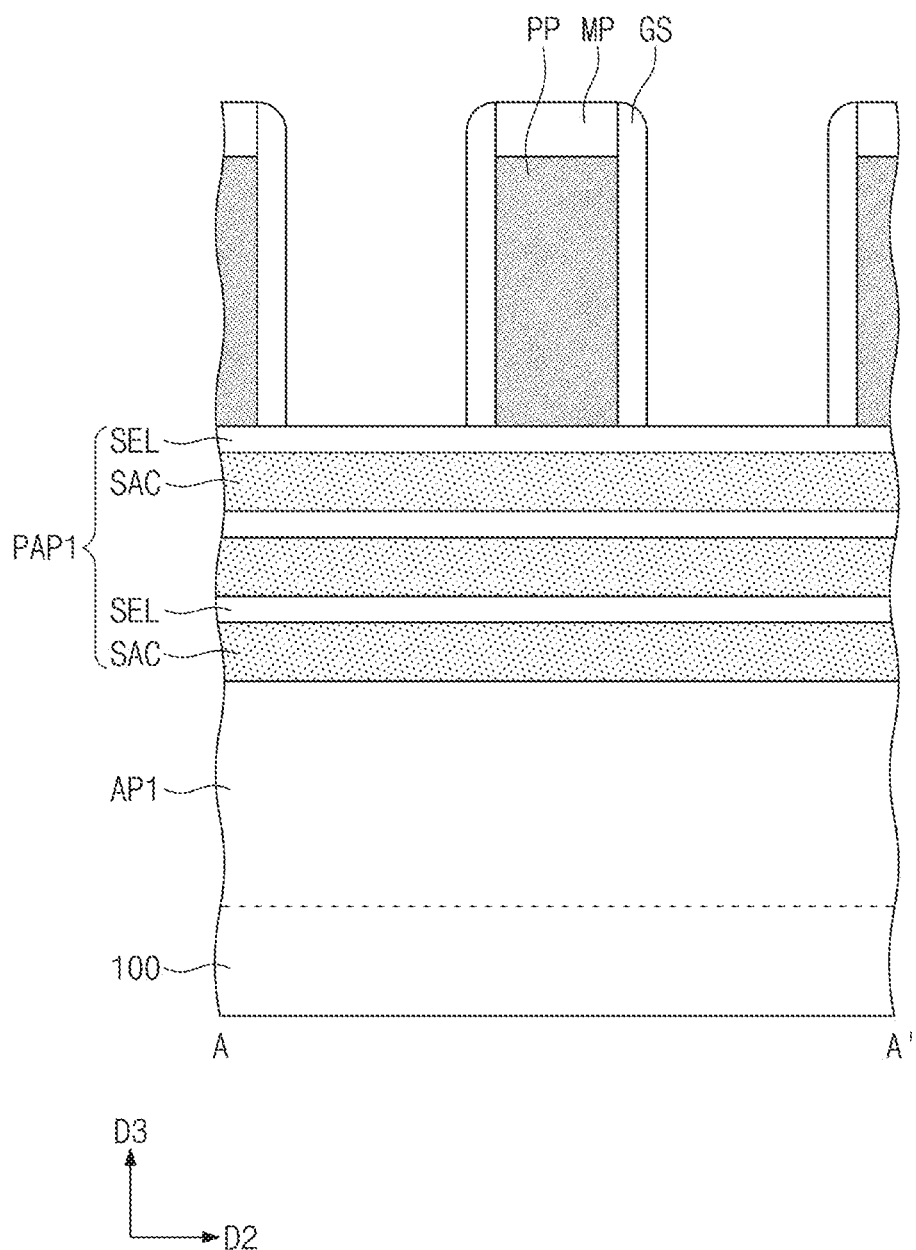
Figure 8B:
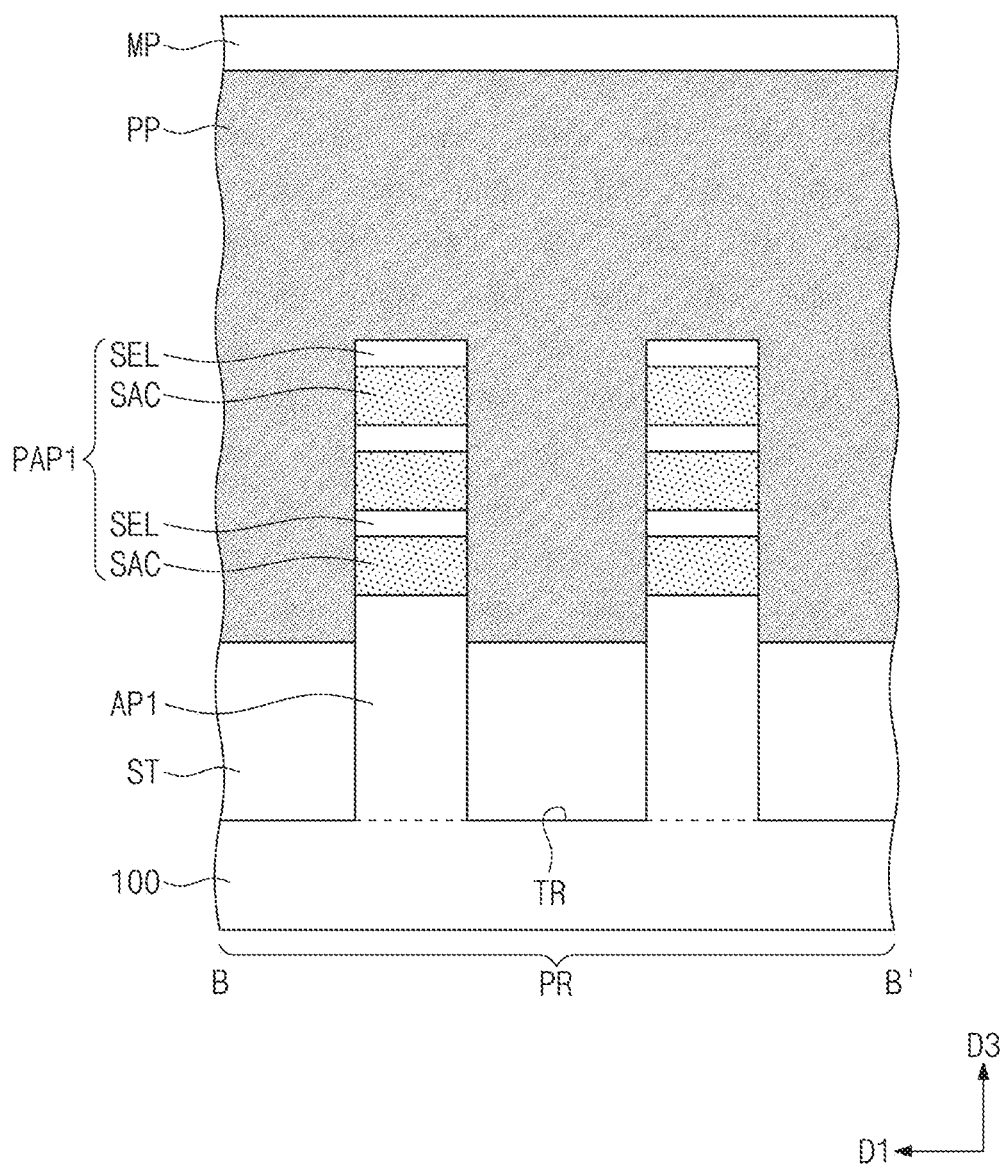
Figure 9:
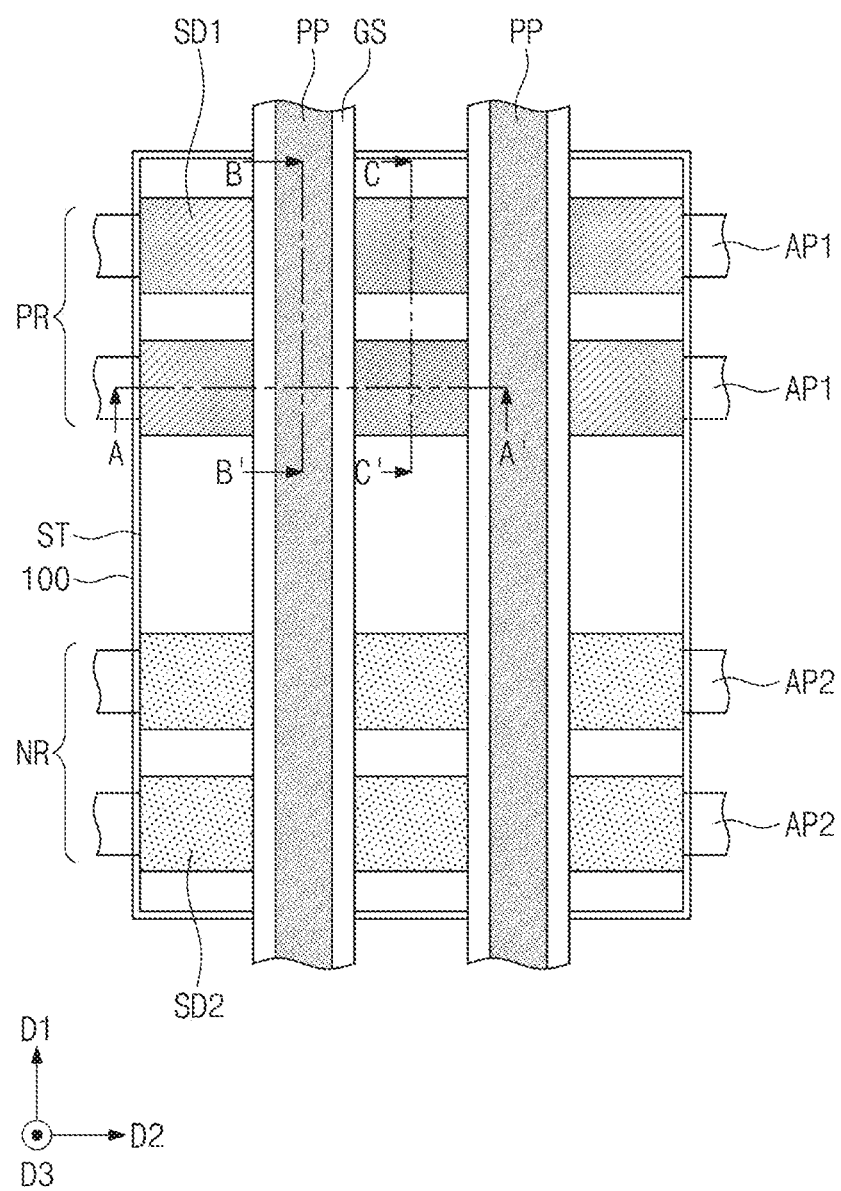

Referring to FIGS. 7, 8A, and 8B, sacrificial patterns PP may be formed to run across the first preliminary pattern PAP1. The sacrificial patterns PP may be formed to have a linear or bar shape extending in the first direction D1.

The formation of the sacrificial patterns PP may include forming a sacrificial layer on the substrate 100, forming mask patterns MP on the sacrificial layer, and etching the sacrificial layer using the mask patterns MP as an etching mask. The sacrificial layer may be formed using, for example, polysilicon. The mask patterns MP may be formed using, for example, a silicon oxide layer, a silicon nitride layer, and/or a silicon oxynitride layer.

A pair of gate spacers GS may be formed on opposite sidewalls of each of the sacrificial patterns PP. The formation of the gate spacers GS may include performing a deposition process, such as CVD or ALD, to form a spacer layer on the entire surface of the substrate 100, and performing an anisotropic etching process on the spacer layer. For example, the gate spacers GS may include, for example, one or more of SiCN, SiCON, and SiN.

Referring to FIGS. 9 and 10A to 10C, the mask patterns MP and the gate spacers GS may be used as an etching mask to etch the first preliminary pattern PAP1 to form first channel patterns CH1. The semiconductor layers SEL of the first preliminary pattern PAP1 may be patterned to form first, second, and third semiconductor patterns SP1, SP2, and SP3. Each of the first channel patterns CH1 may include the first, second, and third semiconductor patterns SP1, SP2, and SP3.

The first preliminary pattern PAP1 may be etched to form first recesses RS1. The first recess RS1 may be formed between a pair of adjacent first channel patterns CH1.

First source/drain patterns SD1 may be formed to fill the first recesses RS1. The formation of the first source/drain patterns SD1 may include performing a selective epitaxial growth process in which the first active pattern AP1 and the first, second, and third semiconductor patterns SP1, SP2, and SP3 on the first active pattern AP1 are used as seed layers. The first source/drain patterns SD1 may be formed of a material that provides the first channel patterns CH1 with compressive strain. For example, the first source/drain patterns SD1 may be formed of a semiconductor element (e.g., SiGe) whose lattice constant is greater than that of a semiconductor element of the substrate 100. During or after the selective epitaxial growth process, the first source/drain patterns SD1 may be doped with p-type impurities.

Referring to FIGS. 11 and 12A to 12C, a first interlayer dielectric layer 110 may be formed on the substrate 100. A planarization process may be performed on the first interlayer dielectric layer 110 until top surfaces of the sacrificial patterns PP are exposed. The planarization process may include an etch-back process and/or a chemical mechanical polishing (CMP) process. When the first interlayer dielectric layer 110 is planarized, the mask patterns MP may also be removed. The first interlayer dielectric layer 110 may be formed using, for example, a silicon oxide layer and/or a silicon oxynitride layer.

A removal process may be performed to remove the sacrificial patterns PP exposed when the planarization process is carried out. The removal of the sacrificial patterns PP may form an empty space between a pair of adjacent gate spacers GS. The empty space may expose the sacrificial layers SAC and the first, second, and third semiconductor patterns SP1, SP2, and SP3.

A selective removal process may be performed to selectively remove the sacrificial layers SAC exposed to the empty space. For example, when the sacrificial layers SAC include silicon-germanium (SiGe), and when the first, second, and third semiconductor patterns SP1, SP2, and SP3 include silicon (Si), the selective removal process may use an etchant including peracetic acid. The etchant may further include hydrofluoric acid (HF) solution and deionized water.

The selective removal of the sacrificial layers SAC may define a first space SA1 between a pair of vertically adjacent ones of the first, second, and third semiconductor patterns SP1, SP2, and SP3. For example, the first space SA1 may be defined between the first and second semiconductor patterns SP1 and SP2. A second space SA2 may be defined on an uppermost semiconductor pattern, or the third semiconductor pattern SP3. The empty space may include the first space SA1 and the second space SP2.

The selective removal of the sacrificial layers SAC may cause the empty space to expose top and bottom surfaces and sidewalls of each of the first, second, and third semiconductor patterns SP1, SP2, and SP3.

Referring to FIGS. 13 and 14A to 14C, an interface layer IL may be conformally formed on the first, second, and third semiconductor patterns SP1, SP2, and SP3 that are exposed to the empty space and on an upper portion of the first active pattern AP1 exposed to the empty space. For example, the interface layer IL may be formed by performing an oxidation process on exposed surfaces of the first, second, and third semiconductor patterns SP1, SP2, and SP3 and on an exposed surface of the upper portion of the first active pattern AP1.

A ferroelectric layer FEL may be conformally formed on the entire surface of the substrate 100. The ferroelectric layer FEL may be formed to partially fill the empty space. For example, the ferroelectric layer FEL may partially fill the first space SA1. The ferroelectric layer FEL may partially fill the second space SA2. The ferroelectric layer FEL may include hafnium oxide doped with (or containing) one or more of zirconium (Zr), silicon (Si), aluminum (Al), and lanthanum (La).

Referring back to FIGS. 1 and 2A to 2C, a gate electrode GE may be formed to fill a remainder of the empty space. The formation of the gate electrode GE may include forming a first work function metal pattern WF1 on the ferroelectric layer FEL, forming a second work function metal pattern WF2 on the first work function metal pattern WF1, and forming an electrode pattern EL on the second work function metal pattern WF2. The first work function metal pattern WF1 may be formed to completely fill the first space SA1. Thus, neither the second work function metal pattern WF2 nor the electrode pattern EL may fill the first space SA1.

A gate capping pattern GP may be formed on the gate electrode GE. A second interlayer dielectric layer 120 may be formed on the first interlayer dielectric layer 110. Active contacts AC may be formed to penetrate the first and second interlayer dielectric layers 110 and 120 and to have connection with the first source/drain patterns SD1.

Figure 15A:
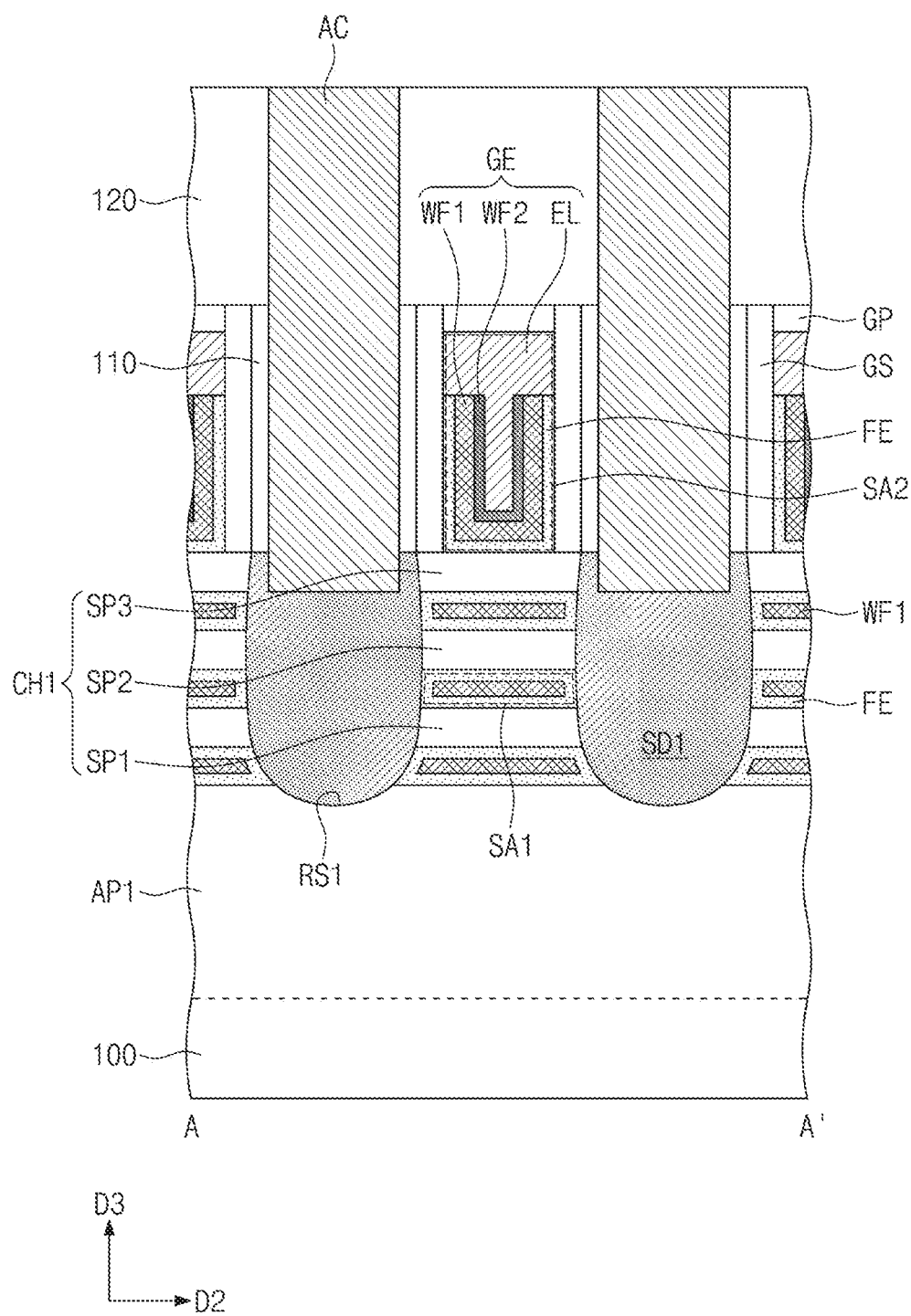
FIGS. 15A and 15B illustrate cross-sectional views, respectively taken along lines A-A' and B-B' of FIG. 1, of a semiconductor device according to some example embodiments of the present inventive concepts.
Figure 15B:
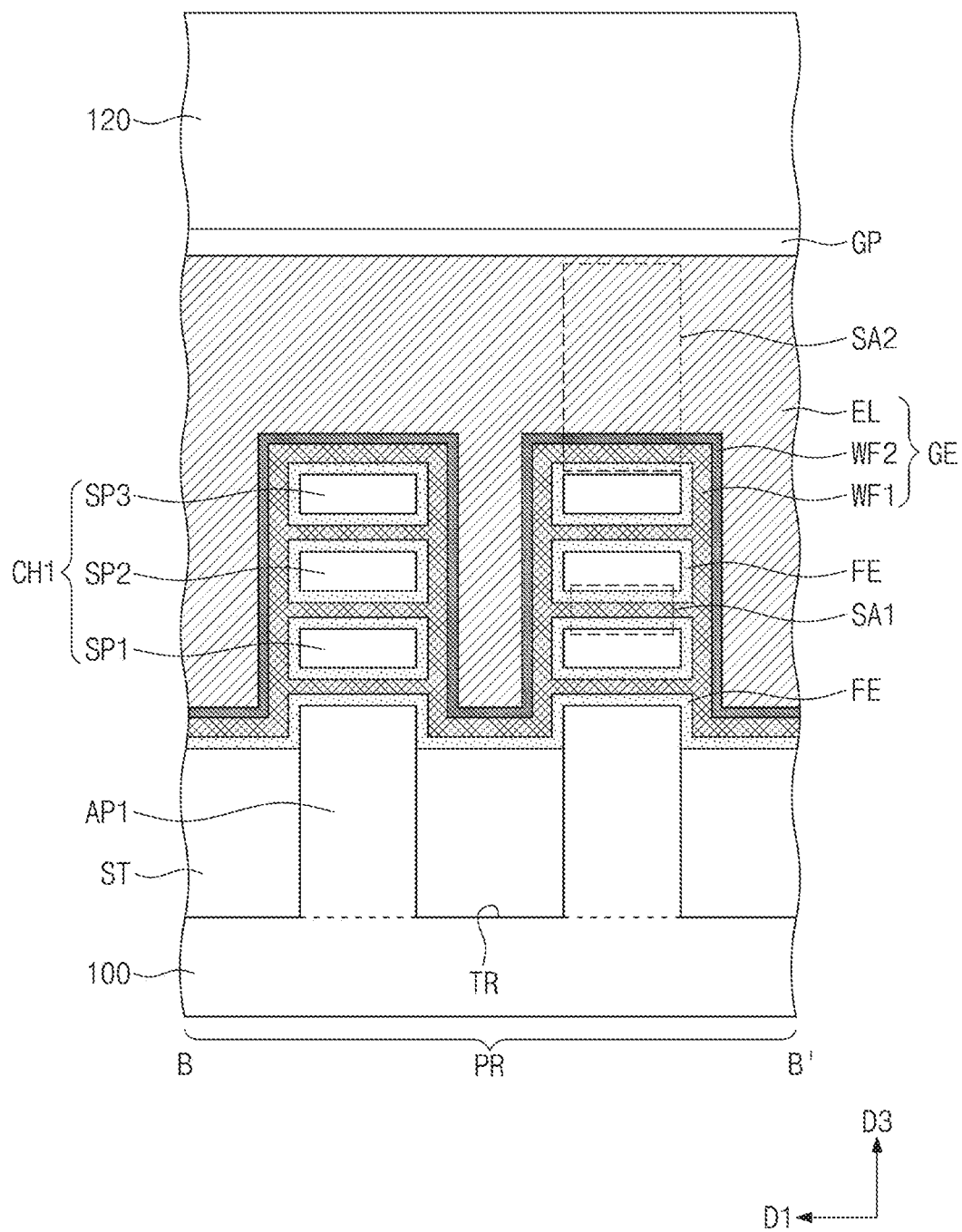

FIGS. 15A and 15B illustrate cross-sectional views respectively taken along lines A-A' and B-B' of FIG. 1, of a semiconductor device according to some example embodiments of the present inventive concepts. Hereinafter, detailed descriptions of technical features discussed above with reference to FIGS. 1 and 2A to 2F may be omitted, and differences from those discussed above with reference to FIGS. 1 and 2A to 2F may be discussed in detail.

Referring to FIGS. 1, 15A, and 15B, the ferroelectric pattern FE may cover each of the first, second, and third semiconductor patterns SP1, SP2, and SP3. For example, no interface layer IL may be provided between the ferroelectric pattern FE and each of the first, second, and third semiconductor patterns SP1, SP2, and SP3. The ferroelectric pattern FE and the first work function metal pattern WF1 may fill the first space SA1 between a pair of vertically adjacent ones of the first, second, and third semiconductor patterns SP1, SP2, and SP3. In some embodiments, the ferroelectric pattern FE may directly contact each of the first, second, and third semiconductor patterns SP1, SP2, and SP3 as shown in FIGS. 15A and 15B.

Figure 16A:
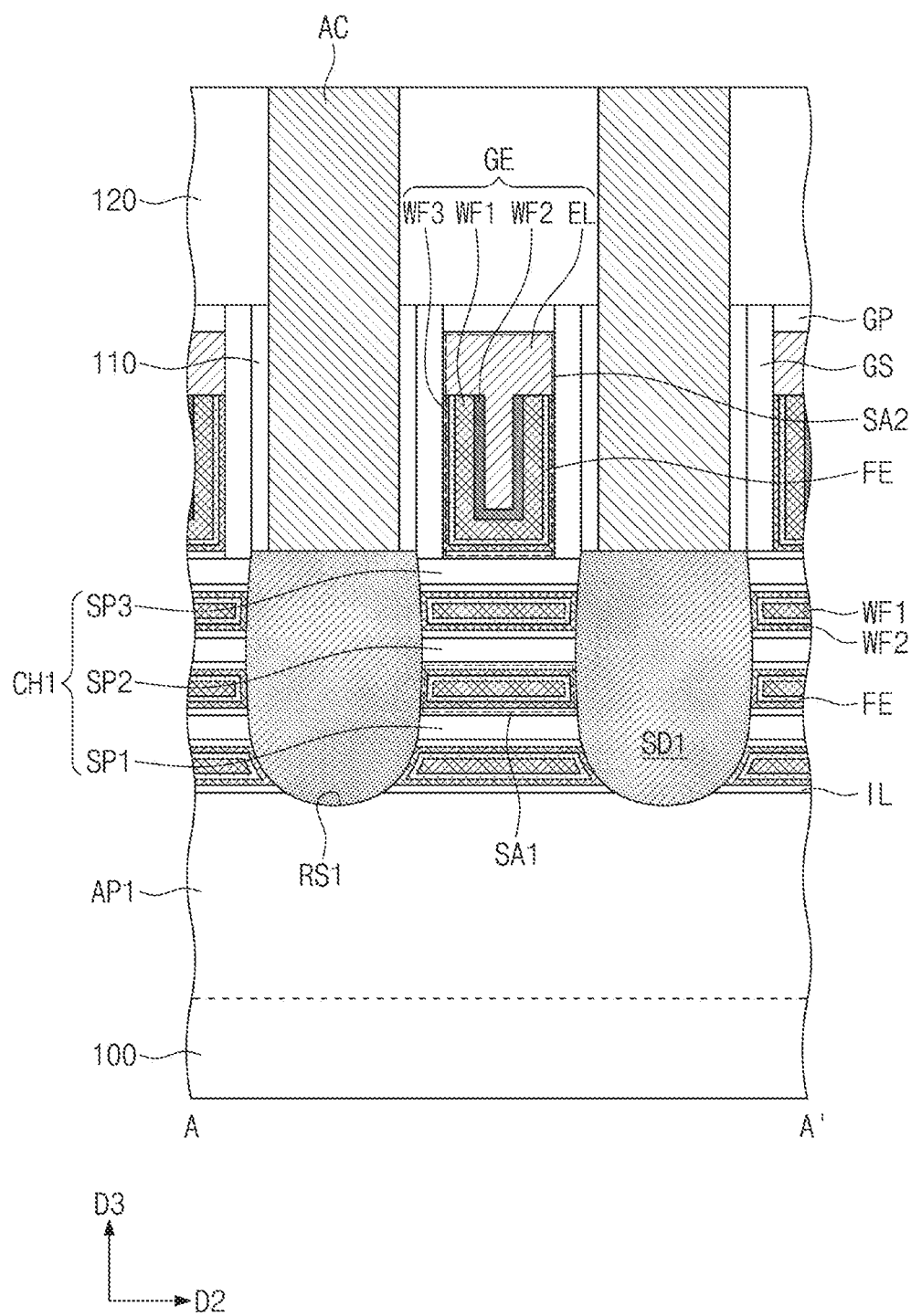
FIGS. 16A and 16B illustrate cross-sectional views, respectively taken along lines A-A' and B-B' of FIG. 1, of a semiconductor device according to some example embodiments of the present inventive concepts.
Figure 16B:
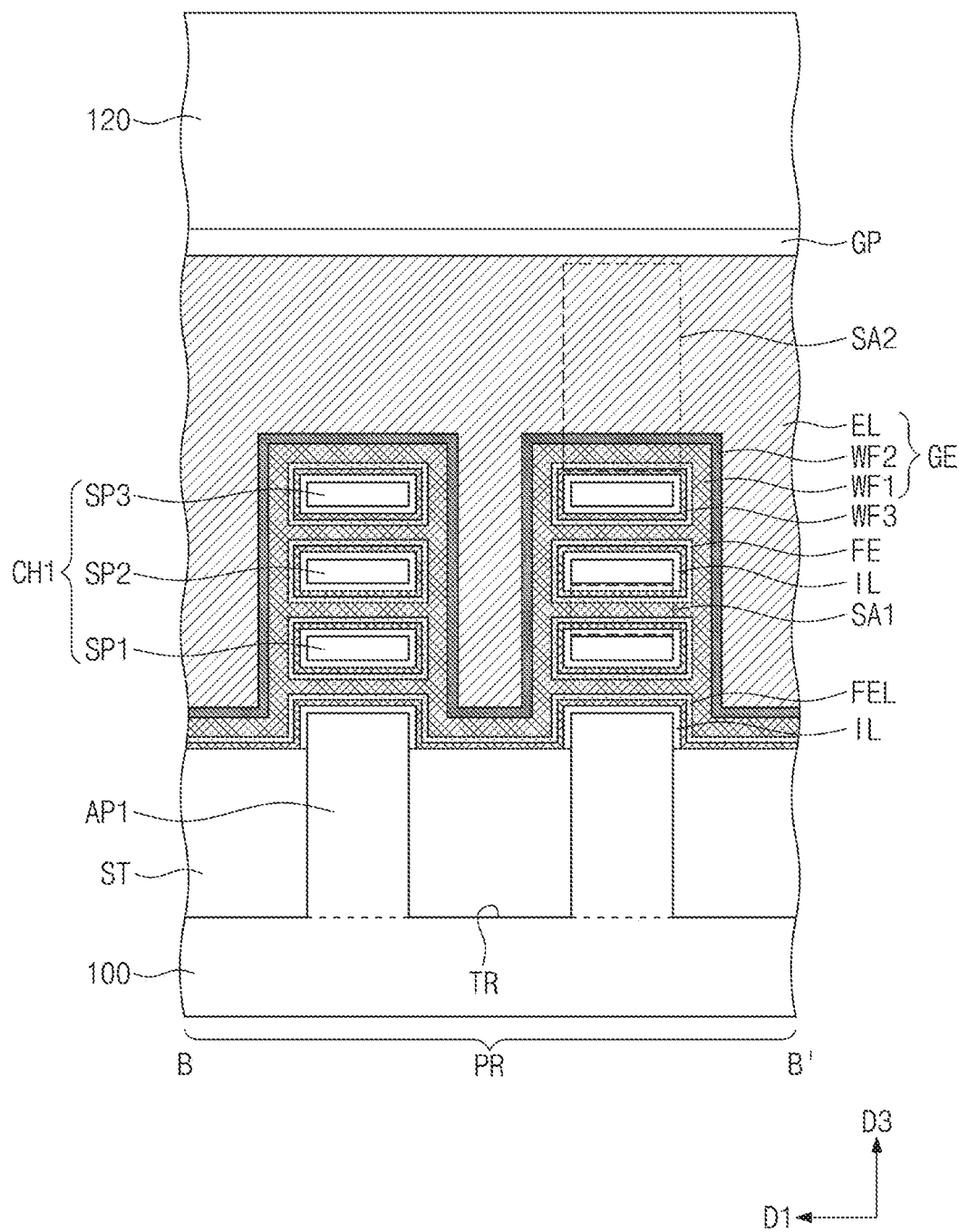

FIGS. 16A and 16B illustrate cross-sectional views respectively taken along lines A-A' and B-B' of FIG. 1, of a semiconductor device according to some example embodiments of the present inventive concepts. In the embodiment that follows, a detailed description of technical features repetitive to those discussed above with reference to FIGS. 1 and 2A to 2F will be omitted, and differences from those discussed above with reference to FIGS. 1 and 2A to 2F will be discussed in detail.

Referring to FIGS. 1, 16A, and 16B, the gate electrode GE may further include a third work function metal pattern WF3. The third work function metal pattern WF3 may be provided on the interface layer IL. The third work function metal pattern WF3 may surround each of the first, second, and third semiconductor patterns SP1, SP2, and SP3. The third work function metal pattern WF3 may include a metal nitride layer, for example, a titanium nitride (TiN) layer and/or a tantalum nitride (TaN) layer.

The ferroelectric pattern FE may be interposed between the third work function metal pattern WF3 and the first work function metal pattern WF1. The interface layer IL, the third work function metal pattern WF3, the ferroelectric pattern FE, and the first work function metal pattern WF1 may fill the first space SA1 between a pair of vertically adjacent ones of the first, second, and third semiconductor patterns SP1, SP2, and SP3.

Figure 17:
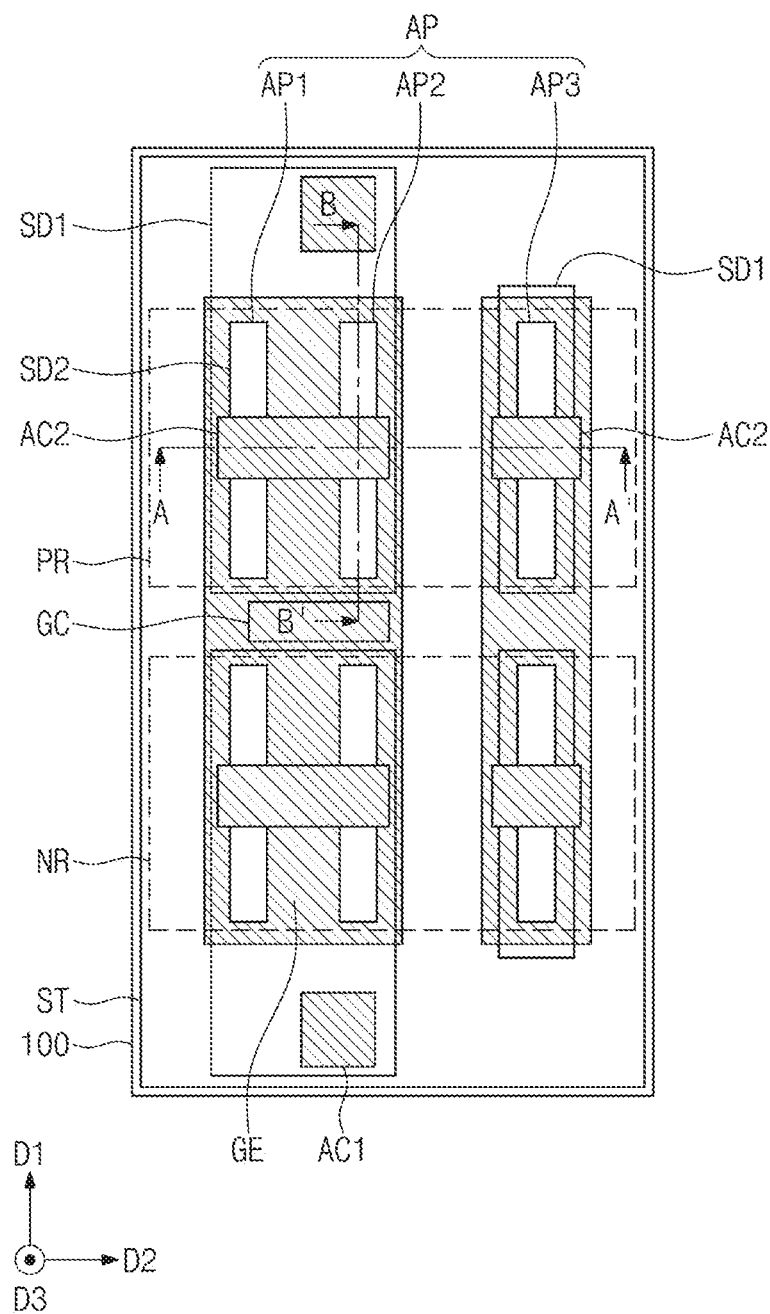
FIG. 17 illustrates a plan view of a semiconductor device according to some example embodiments of the present inventive concepts.
Figure 18A:
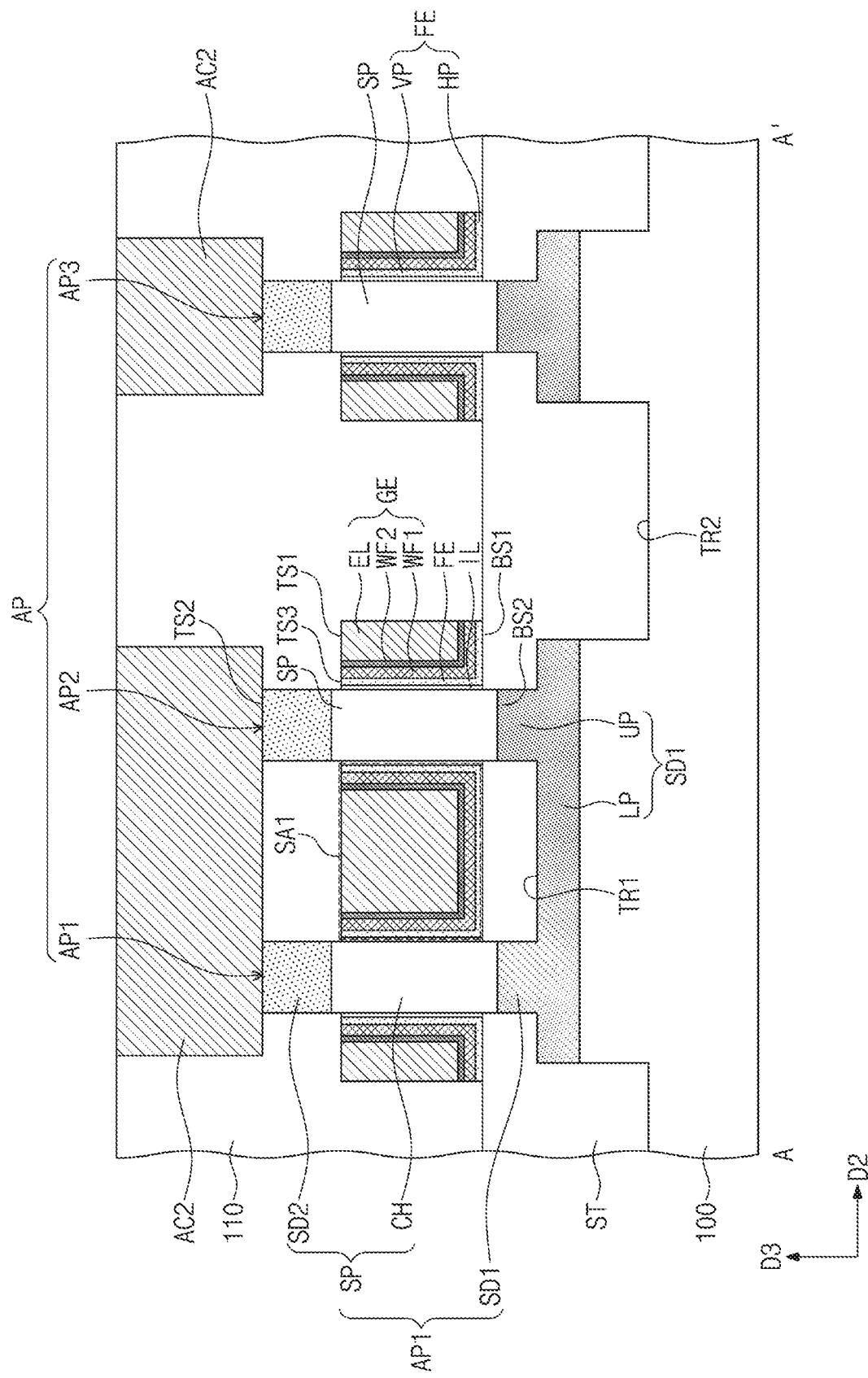
FIGS. 18A and 18B illustrate cross-sectional views respectively taken along lines A-A' and B-B' of FIG. 17.
Figure 18B:
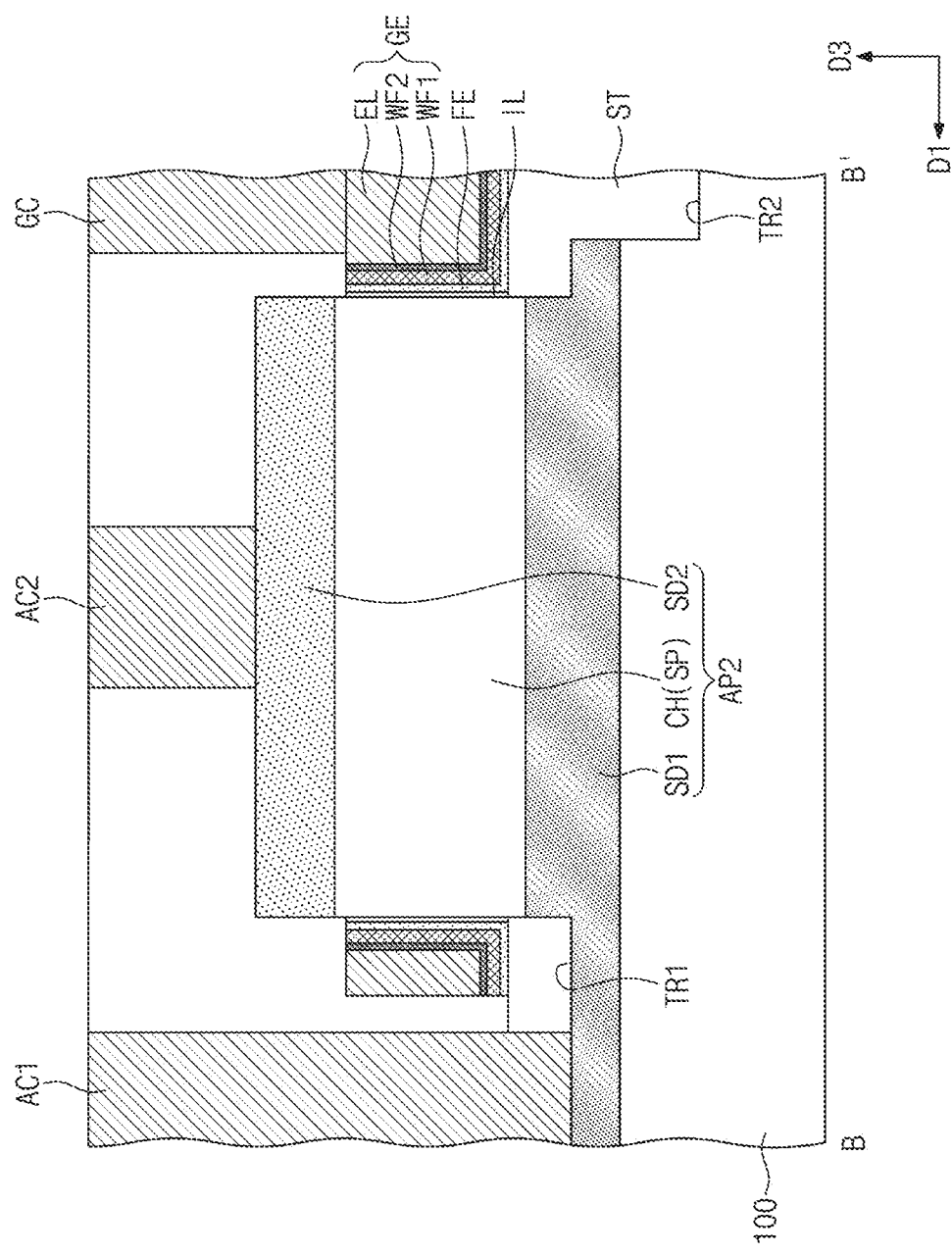

FIG. 17 illustrates a plan view of a semiconductor device according to some example embodiments of the present inventive concepts. FIGS. 18A and 18B illustrate cross-sectional views respectively taken along lines A-A' and B-B' of FIG. 17.

Referring to FIGS. 17, 18A, and 18B, a substrate 100 may be provided that has a PMOSFET region PR and an NMOSFET region NR. FIG. 17 shows that the substrate 100 has a zone, or a logic area. Logic transistors may be provided on the zone of the substrate 100. The logic transistors may include first transistors on the PMOSFET region PR and second transistors on the NMOSFET region NR.

A plurality of active patterns AP may be provided on the PMOSFET region PR and the NMOSFET region NR. Each of the active patterns AP may have a bar shape extending in a first direction D1. The active patterns AP on the PMOSFET region PR may be arranged in a second direction D2. The active patterns AP on the NMOSFET region NR may be arranged in the second direction D2. In some embodiments, the active patterns AP on the PMOSFET region PR may be spaced apart from each other in the second direction D2, and the active patterns AP on the NMOSFET region NR may be spaced apart from each other in the second direction D2, as shown in FIG. 17. For example, the active patterns AP may include first, second, and third active patterns AP1, AP2, and AP3 on the PMOSFET region PR.

A first trench TR1 and a second trench TR2 may be formed on an upper portion of the substrate 100. For example, the first trench TR1 may be disposed between the first and second active patterns AP1 and AP2 that are adjacent to each other. The second trench TR2 may be disposed between the second and third active patterns AP2 and AP3. The second trench TR2 may be positioned between the PMOSFET region PR and the NMOSFET region NR. The second trench TR2 may be deeper than the first trench TR1. The substrate 100 may be provided thereon with a device isolation layer ST that fills the first and second trenches TR1 and TR2.

Each of the active patterns AP may include a first source/drain pattern SD1. The first source/drain pattern SD1 may be formed by implanting impurities into the upper portion of the substrate 100. The first trench TR1 may define an upper part UP and a lower part LP of the first source/drain pattern SD1. The first trench TR1 may define a sidewall of the upper part UP of the first source/drain pattern SD1. The lower part LP of the first source/drain pattern SD1 may be lower than the first trench TR1. The first source/drain pattern SD1 may have a top surface lower than that of the device isolation layer ST.

Each of the active patterns AP may further include a semiconductor pattern SP on the first source/drain pattern SD1. The semiconductor pattern SP may vertically protrude relative to the device isolation layer ST. The semiconductor pattern SP may include a channel pattern CH and a second source/drain pattern SD2 on the channel pattern CH. The channel pattern CH may be interposed between the first source/drain pattern SD1 and the second source/drain pattern SD2. The semiconductor pattern SP may include one or more of silicon (Si), germanium (Ge), and silicon-germanium (SiGe).

On the PMOSFET region PR, the first and second source/drain patterns SD1 and SD2 may be p-type impurity regions. On the NMOSFET region NR, the first and second source/drain patterns SD1 and SD2 may be n-type impurity regions.

The first and second active patterns AP1 and AP2 may share the first source/drain pattern SD1. For example, the semiconductor pattern SP of the first active pattern AP1 may be disposed on a first upper part UP of the first source/drain pattern SD1, and the semiconductor pattern SP of the second active pattern AP2 may be disposed on a second upper part UP of the first source/drain pattern SD1.

The lower part LP of the first source/drain pattern SD1 of the first and second active patterns AP1 and AP2 may have a segment extending in the first direction D1 (see FIG. 18B). A first active contact AC1, which will be discussed below, may be connected to the segment extending in the first direction D1 of the first source/drain pattern SD1.

The device isolation layer ST may be provided thereon with a gate electrode GE that surrounds the channel pattern CH of the semiconductor pattern SP. When viewed in plan, the gate electrode GE may surround a sidewall (e.g., four sidewalls) of the channel pattern CH (see FIG. 17). For example, a first gate electrode GE may surround the channel patterns CH of the first and second active patterns AP1 and AP2. A second gate electrode GE may surround the channel pattern CH of the third active pattern AP3.

The gate electrode GE may have a bar or linear shape extending in the first direction D1. At least one gate electrode GE may surround both the active pattern AP on the PMOSFET region PR and the active pattern AP on the NMOSFET region NR. The gate electrode GE may have a top surface TS1 lower than a top surface TS2 of the semiconductor pattern SP. The gate electrode GE may have a bottom surface BS1 higher than a bottom surface BS2 of the semiconductor pattern SP.

The gate electrode GE may include a first work function metal pattern WF1, a second work function metal pattern WF2, and an electrode pattern EL. The second work function metal pattern WF2 may be disposed on the first work function metal pattern WF1, and the electrode pattern EL may be disposed on the second work function metal pattern WF2. A detailed description of the first work function metal pattern WF1, the second work function metal pattern WF2, and the electrode pattern EL may be identical or similar to that discussed above with reference to FIGS. 1 and 2A to 2F.

An interface layer IL may be provided to surround the channel pattern CH of the semiconductor pattern SP. The interface layer IL may directly cover the sidewall of the channel pattern CH. The first work function metal pattern WF1 may surround the channel pattern CH of the semiconductor pattern SP. A ferroelectric pattern FE may be provided between the channel pattern CH and the first work function metal pattern WF1. A detailed description of the interface layer IL and the ferroelectric pattern FE may be identical or similar to that discussed above with reference to FIGS. 1 and 2A to 2F. In some embodiments, as discussed above with reference to FIGS. 15A and 15B, no interface layer IL may be provided.

The ferroelectric pattern FE may include a vertical extension part VP and a horizontal extension part HP. The vertical extension part VP may extend in a third direction D3 (or a direction perpendicular to a top surface of the substrate 100) along the sidewall of the channel pattern CH. The vertical extension part VP may be interposed between the interface layer IL and the first work function metal pattern WF1. The horizontal extension part HP may be interposed between the device isolation layer ST and the first work function metal pattern WF1. The ferroelectric pattern FE may have a top surface TS3, or a top surface of the vertical extension part VP, may be coplanar with the top surface TS1 of the gate electrode GE.

A first space SA1 may be defined between the semiconductor pattern SP of the first active pattern AP1 and the semiconductor pattern SP of the second active pattern AP2. For example, the first space SA1 may be defined between a pair of vertically adjacent semiconductor patterns SP.

The first space SA1 may be filled with the interface layer IL, the ferroelectric pattern FE, the first work function metal pattern WF1, the second work function metal pattern WF2, and the electrode pattern EL. The electrode pattern EL may completely fill remaining portions of the first space SA1 that are not occupied by the interface layer IL, the ferroelectric pattern FE, the first work function metal pattern WF1, and the second work function metal pattern WF2.

In some embodiments, as discussed above with reference to FIGS. 16A and 16B, the gate electrode GE may further include a third work function metal pattern WF3. The third work function metal pattern WF3 may be interposed between the interface layer IL and the ferroelectric pattern FE.

A first interlayer dielectric layer 110 may be provided to cover the gate electrodes GE and the active patterns AP. Each of the second source/drain patterns SD2 may vertically protrude above the gate electrode GE. A second active contact AC2 may be provided to penetrate the first interlayer dielectric layer 110 and to have connection with the second source/drain pattern SD2. For example, the second source/drain patterns SD2 of the first and second active patterns AP1 and AP2 may be connected in common to a single second active contact AC2.

A first active contact AC1 may be provided to penetrate the first interlayer dielectric layer 110 and the device isolation layer ST and to have connection with the first source/drain pattern SD1. A gate contact GC may be provided to penetrate the first interlayer dielectric layer 110 and to have connection with the gate electrode GE.

Figure 19:
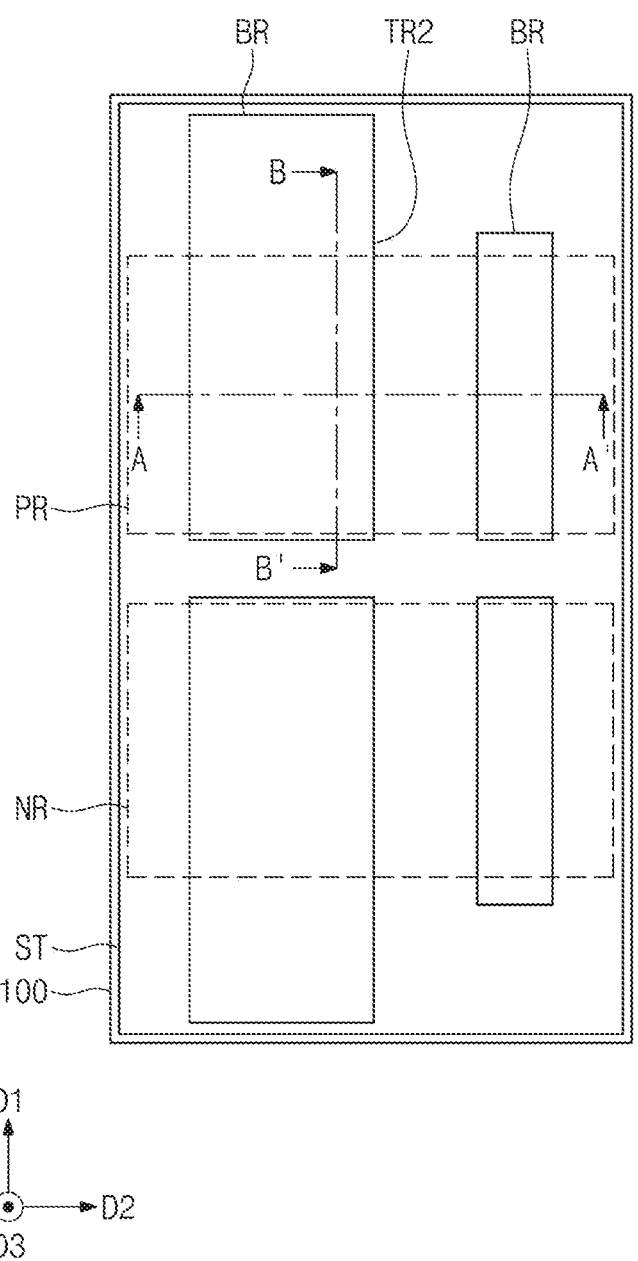
FIGS. 19, 21, and 23 illustrate plan views showing a method of fabricating a semiconductor device according to some example embodiments of the present inventive concepts.
Figure 20A:
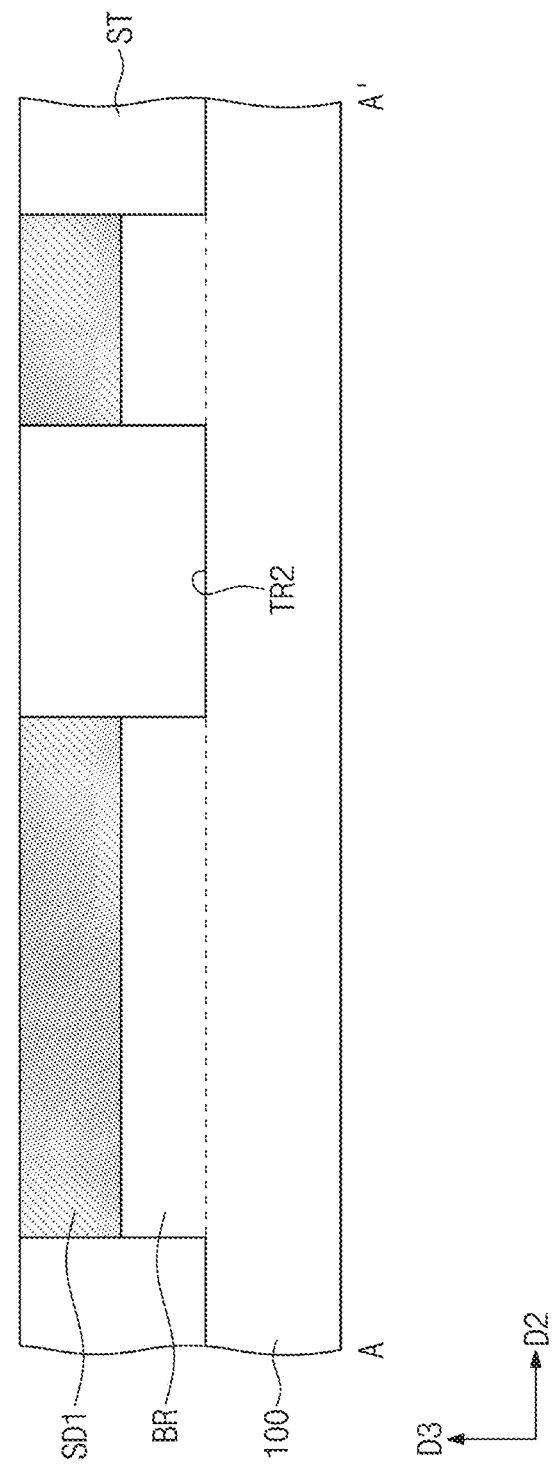
FIGS. 20A, 22A, and 24A illustrate cross-sectional views taken along line A-A' of FIGS. 19, 21, and 23, respectively.
Figure 20B:
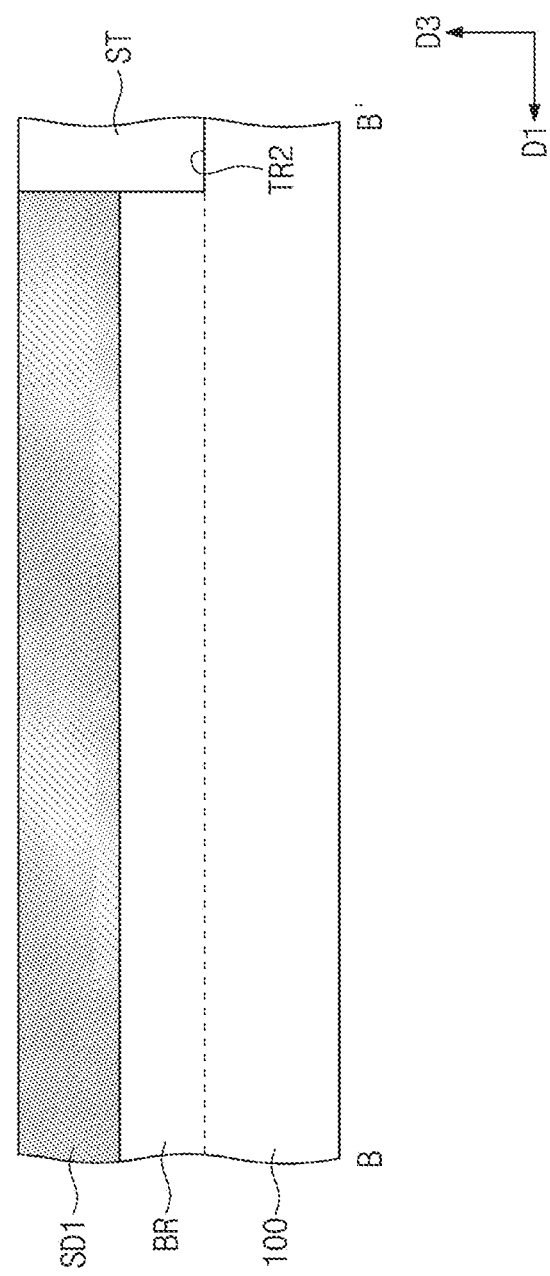
FIGS. 20B, 22B, and 24B illustrate cross-sectional views taken along line B-B' of FIGS. 19, 21, and 23, respectively.
Figure 21:
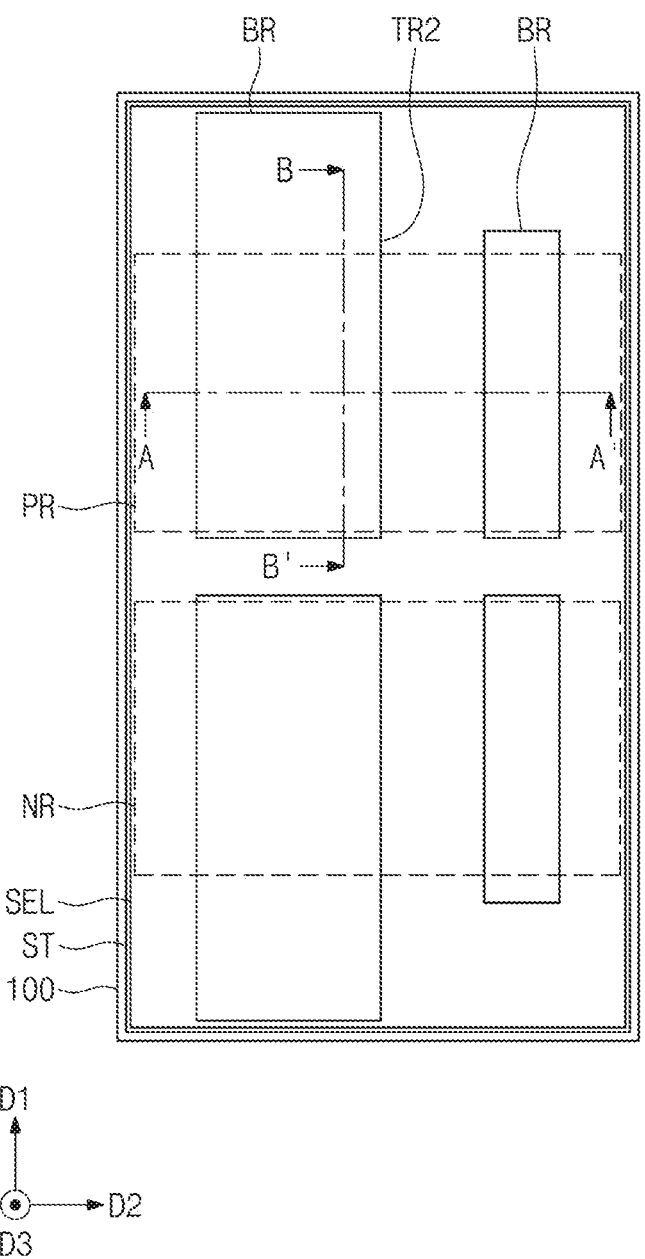
Figure 22A:
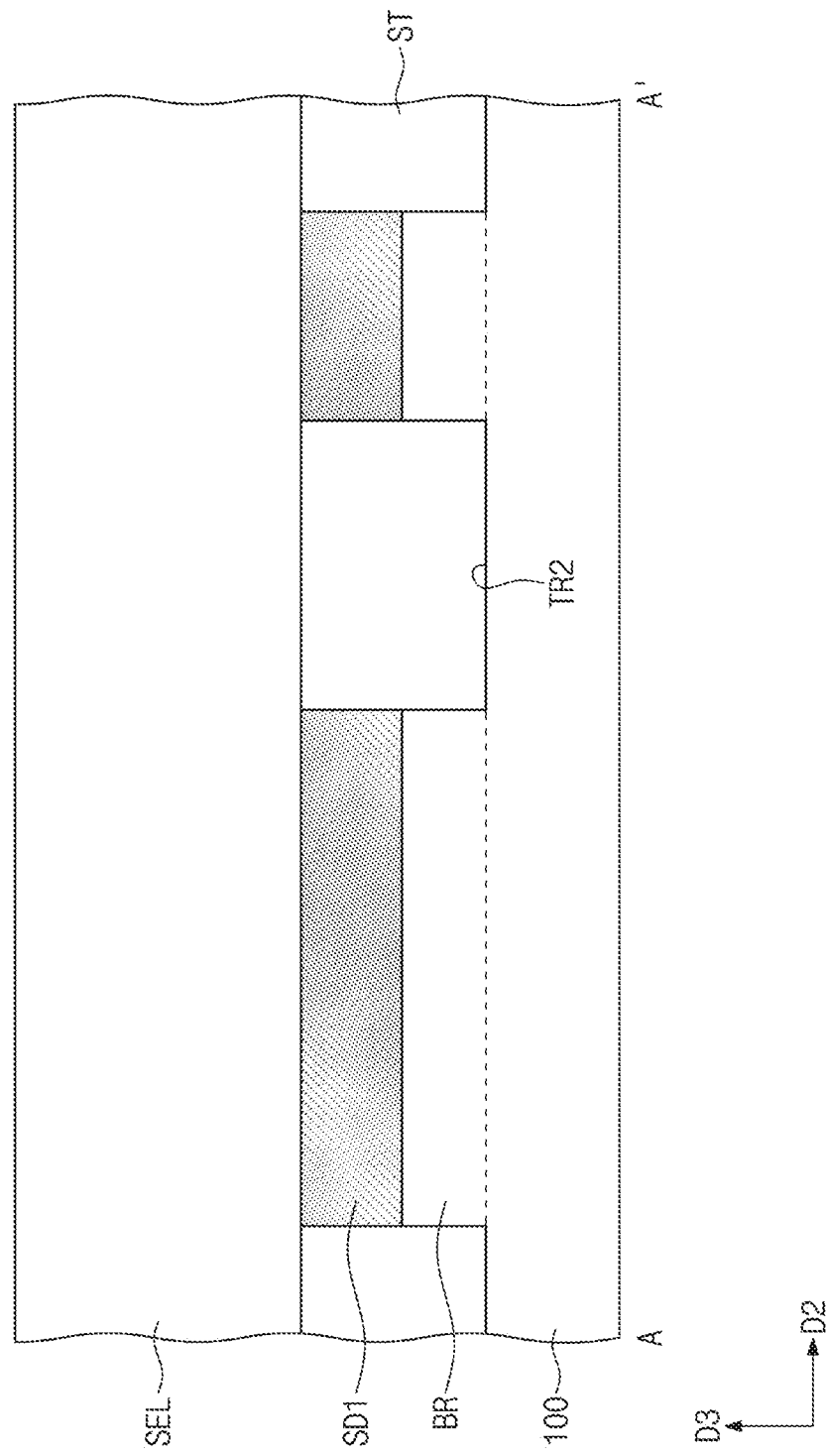
Figure 22B:
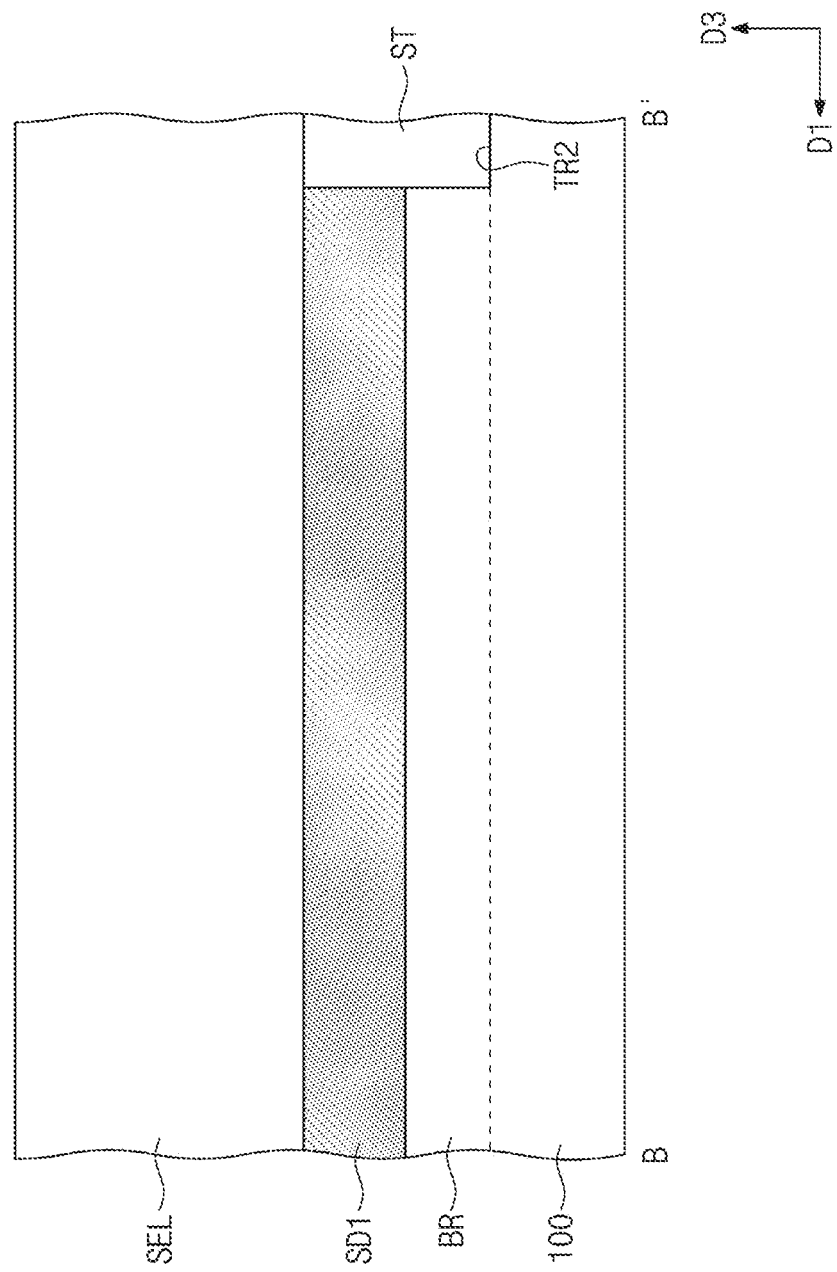
Figure 23:
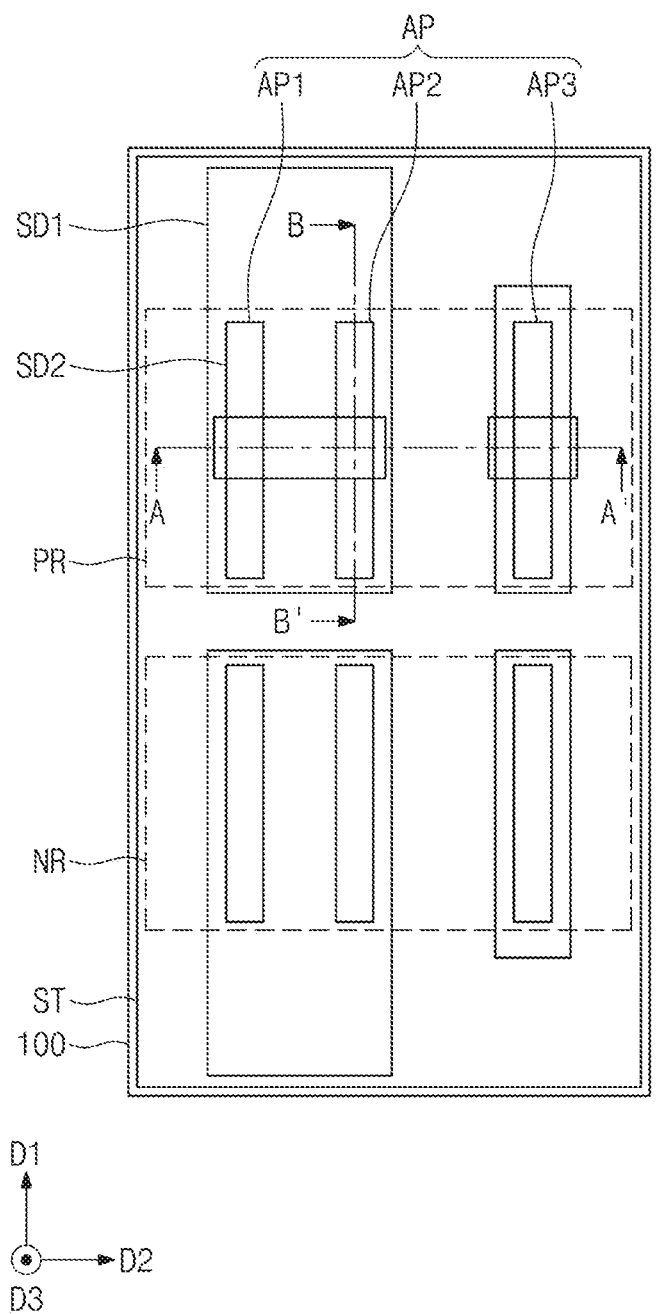
Figure 24A:
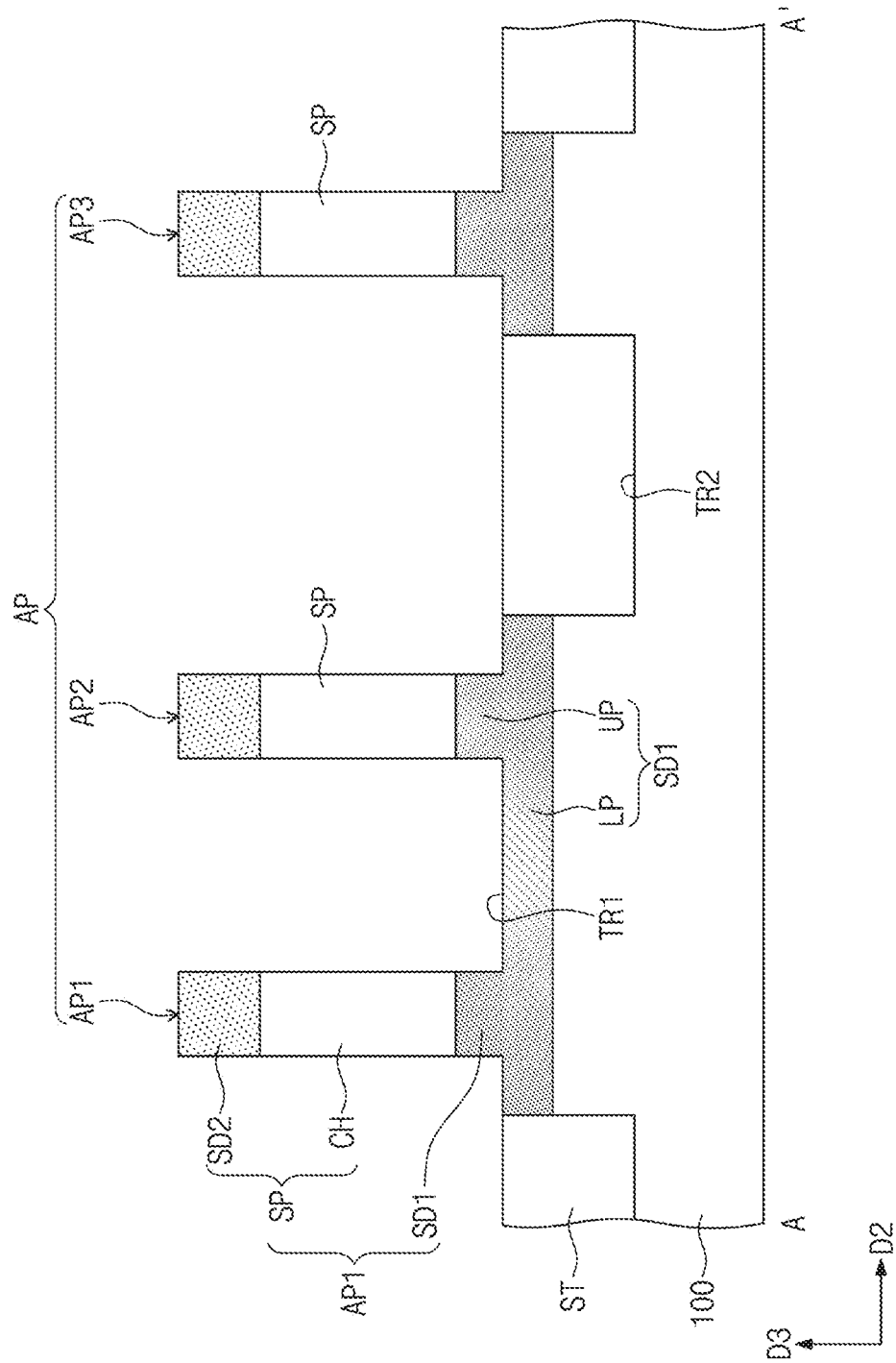
Figure 24B:
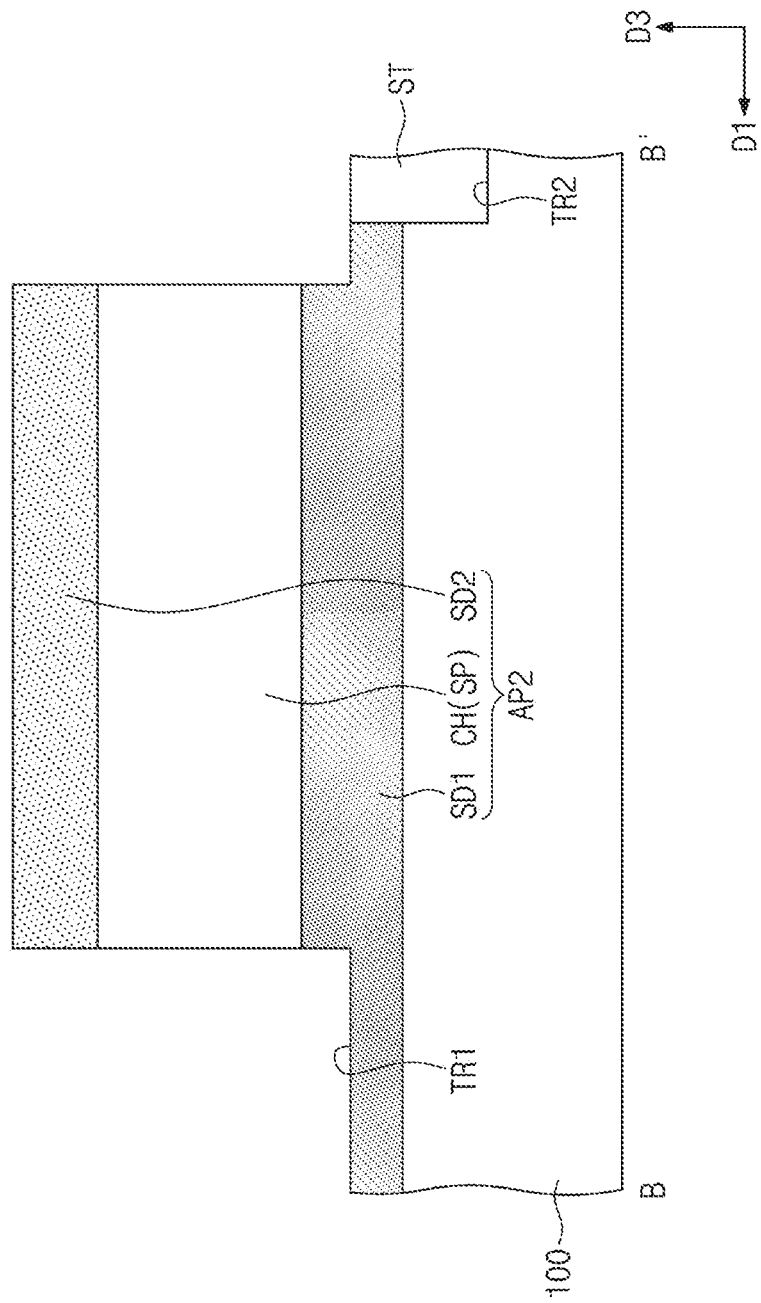

FIGS. 19, 21, and 23 illustrate plan views showing a method of fabricating a semiconductor device according to some example embodiments of the present inventive concepts. FIGS. 20A, 22A, and 24A illustrate cross-sectional views taken along line A-A' of FIGS. 19, 21, and 23, respectively. FIGS. 20B, 22B, and 24B illustrate cross-sectional views taken along line B-B' of FIGS. 19, 21, and 23, respectively.

Referring to FIGS. 19, 20A, and 20B, an upper portion of a substrate 100 may be patterned to form a second trench TR2. The second trench TR2 may define base regions BR on the upper portion of the substrate 100. The base regions BR may be positioned on a PMOSFET region PR and an NMOSFET region NR of the substrate 100.

A device isolation layer ST may be formed to fill the second trench TR2. The formation of the device isolation layer ST may include forming on the substrate 100 a dielectric layer to fill the second trench TR2 and performing a planarization process on the dielectric layer until top surfaces of the based regions BR are exposed.

The base regions BR may be doped with impurities to form first source/drain patterns SD1. A p-type impurity region may be formed on the base regions BR of the PMOSFET region PR, and an n-type impurity region may be formed on the base regions BR of the NMOSFET region NR.

Referring to FIGS. 21, 22A, and 22B, an entire surface of the substrate 100 may undergo an epitaxial growth process to form a semiconductor layer SEL. The epitaxial growth process may be carried out using a semiconductor element identical to or different from that of the substrate 100. For example, the epitaxial growth process may be performed using one or more of silicon (Si), germanium (Ge), and silicon-germanium (SiGe).

Referring to FIGS. 23, 24A, and 24B, the semiconductor layer SEL may be doped with impurities to form a second source/drain pattern SD2. A p-type impurity region may be formed on the semiconductor layer SEL of the PMOSFET region PR. An n-type impurity region may be formed on the semiconductor layer SEL of the NMOSFET region NR.

The semiconductor layer SEL may be patterned to form semiconductor patterns SP. While the semiconductor layer SEL is patterned, the first source/drain pattern SD1 may be partially etched to form a first trench TR1.

The semiconductor pattern SP may be formed to have a semiconductor pillar shape that vertically protrudes from a top surface of the substrate 100. A channel pattern CH may be defined to refer to as a non-doped region of the semiconductor pattern SP. The channel pattern CH may be interposed between the first source/drain pattern SD1 and the second source/drain pattern SD2.

An active pattern AP may be defined by the first source/drain pattern SD1 and the semiconductor pattern SP. The active pattern AP may include the first source/drain pattern SD1, the channel pattern CH, and the second source/drain pattern SD2. For example, the active patterns AP may include first, second, and third active patterns AP1, AP2, and AP3 on the PMOSFET region PR.

Referring back to FIGS. 17, 18A, and 18B, a dielectric layer may be formed to fill the first trench TR1, and thus the device isolation layer ST may cover the first source/drain pattern SD1. The device isolation layer ST may expose the semiconductor patterns SP.

The exposed semiconductor patterns SP may undergo, for example, an oxidation process to conformally form an interface layer IL on the semiconductor patterns SP. A ferroelectric pattern FE and a gate electrode GE may be formed to surround a sidewall of the semiconductor pattern SP.

For example, the formation of the ferroelectric pattern FE and the gate electrode GE may include sequentially forming a ferroelectric layer, a first work function metal layer, a second work function metal layer, and an electrode layer on the entire surface of the substrate 100, and recessing the ferroelectric layer, the first work function metal layer, the second work function metal layer, and the electrode layer until the second source/drain pattern SD2 is exposed.

A first interlayer dielectric layer 110 may be formed to cover the active patterns AP and the gate electrodes GE. A first active contact AC1 may be formed to penetrate the first interlayer dielectric layer 110 and to have connection with the first source/drain pattern SD1. A second active contact AC2 may be formed to penetrate the first interlayer dielectric layer 110 and to have connection with the second source/drain pattern SD2. A gate contact GC may be formed to penetrate the first interlayer dielectric layer 110 and to have connection with the gate electrode GE.

In a semiconductor device according to the present inventive concepts, a transistor may have improved sub-threshold swing characteristics and lower operating voltage.

Although some example embodiments of the present inventive concepts have been discussed with reference to accompanying figures, it will be understood that various changes in form and details may be made therein without departing from the spirit and scope of the present inventive concepts. It therefore will be understood that the some example embodiments described above are just illustrative but not limitative in all aspects. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
a pair of semiconductor patterns adjacent to each other on the substrate and spaced apart from each other in a vertical direction;
a gate electrode on the pair of semiconductor patterns;
a source/drain pattern connected to the pair of semiconductor patterns;
a first ferroelectric pattern between surfaces of the pair of semiconductor patterns, the surfaces of the pair of semiconductor patterns facing each other, and the first ferroelectric pattern defining a first space between the surfaces of the pair of semiconductor patterns; and
a second ferroelectric pattern between the substrate and the pair of semiconductor patterns,
wherein the first ferroelectric pattern is spaced apart from the second ferroelectric pattern in the vertical direction, and one of the pair of semiconductor patterns separates the first ferroelectric pattern from the second ferroelectric pattern,
wherein the gate electrode comprises a work function metal pattern that is in the first space and between the surfaces of the pair of semiconductor patterns, and
wherein the first ferroelectric pattern encloses the work function metal pattern that is in the first space.

2. The semiconductor device of claim 1, further comprising an interface layer between the first ferroelectric pattern and the pair of semiconductor patterns.

3. The semiconductor device of claim 1, wherein each of the first ferroelectric pattern and the second ferroelectric pattern comprises hafnium oxide that comprises zirconium (Zr), silicon (Si), aluminum (Al) and/or lanthanum (La).

4. The semiconductor device of claim 1, wherein the work function metal pattern comprises a titanium nitride layer and/or a tantalum nitride layer.

5. The semiconductor device of claim 1, wherein the vertical direction is perpendicular to a top surface of the substrate.

6. The semiconductor device of claim 5, wherein the gate electrode further comprises an electrode pattern, and
wherein the electrode pattern is not in the first space.

7. The semiconductor device of claim 5, further comprising a device isolation layer defining an active pattern on an upper portion of the substrate,
wherein the pair of semiconductor patterns are on the active pattern,
wherein the second ferroelectric pattern extends between the gate electrode and the device isolation layer.

8. A semiconductor device comprising:
a substrate;
a first source/drain pattern on the substrate;

a pair of semiconductor patterns on the first source/drain pattern, the pair of semiconductor patterns extending in a vertical direction that is perpendicular to a top surface of the substrate;

a pair of second source/drain patterns on the pair of semiconductor patterns, respectively, wherein the pair of second source/drain patterns are spaced apart from the first source/drain pattern in the vertical direction, the pair of semiconductor patterns are between the first source/drain pattern and the pair of second source/drain patterns, and each of the pair of semiconductor patterns directly contacts both the first source/drain pattern and a respective one of the pair of second source/drain patterns;

a gate electrode on sidewalls of the pair of semiconductor patterns; and a ferroelectric pattern between the gate electrode and the pair of semiconductor patterns, wherein the gate electrode includes:

a first work function metal pattern on the ferroelectric pattern;

a second work function metal pattern on the first work function metal pattern; and an electrode pattern on the second work function metal pattern.

9. The semiconductor device of claim 8, wherein the ferroelectric pattern directly contacts the pair of semiconductor patterns.

10. The semiconductor device of claim 8, further comprising an interface layer between the ferroelectric pattern and the pair of semiconductor patterns.

11. The semiconductor device of claim 8, wherein the ferroelectric pattern comprises zirconium-doped hafnium oxide (ZrHfO) having an atomic ratio of Zr/(Zr+Hf) ranging from about 45 at % to about 55 at %, silicon-doped hafnium oxide (SiHfO) having an atomic ratio of Si/(Si+Hf) ranging from about 4 at % to about 6 at %, aluminum-doped hafnium oxide (AlHfO) having an atomic ratio of Al/(Al+Hf) ranging from about 5 at % to about 10 at %, or lanthanum-doped hafnium oxide (LaHfO) having an atomic ratio of La/(La+Hf) ranging from about 5 at % to about 10 at %.

12. The semiconductor device of claim 8, wherein the pair of semiconductor patterns are spaced apart from each other in a horizontal direction that is parallel to the top surface of the substrate.

13. The semiconductor device of claim 12, further comprising a device isolation layer between the gate electrode and the first source/drain pattern, wherein the ferroelectric pattern comprises a vertical extension part and a horizontal extension part, wherein the vertical extension part extends along one of the sidewalls of the pair of semiconductor patterns in the vertical direction, and wherein the horizontal extension part extends between the gate electrode and the device isolation layer in the horizontal direction.

14. A semiconductor device comprising:

a substrate;

an active pattern on the substrate, the active pattern comprising a first source/drain pattern, a semiconductor pattern on the first source/drain pattern, and a second source/drain pattern on the semiconductor pattern, wherein the semiconductor pattern extends in a vertical direction that is perpendicular to a top surface of the substrate, and the first source/drain pattern, the semiconductor pattern, and the second source/drain pattern are sequentially stacked on the substrate in the vertical direction, and wherein the semiconductor pattern is between the first source/drain pattern and the second source/drain pattern and directly contacts both the first source/drain pattern and the second source/drain pattern;

a gate electrode on a sidewall of the semiconductor pattern;

a ferroelectric pattern between the gate electrode and the semiconductor pattern; and a device isolation layer between the gate electrode and the first source/drain pattern, wherein the ferroelectric pattern comprises a vertical extension part and a horizontal extension part, wherein the vertical extension part extends along the sidewall of the semiconductor pattern in the vertical direction, wherein the horizontal extension part extends between the gate electrode and the device isolation layer in a horizontal direction that is parallel to the top surface of the substrate, and the horizontal extension part directly contacts the device isolation layer, wherein a top surface of the gate electrode is lower than a top surface of the second source/drain pattern, and wherein the gate electrode includes:

a first work function metal pattern on the ferroelectric pattern;

a second work function metal pattern on the first work function metal pattern; and an electrode pattern on the second work function metal pattern.

15. The semiconductor device of claim 14, wherein a top surface of the ferroelectric pattern is coplanar with the top surface of the gate electrode.

16. The semiconductor device of claim 14, further comprising an interface layer between the semiconductor pattern and the ferroelectric pattern.

* * * * *